United States Patent
Iwane

(10) Patent No.: US 8,120,396 B2
(45) Date of Patent: Feb. 21, 2012

(54) DELAY LOCKED LOOP CIRCUIT

(75) Inventor: Masaaki Iwane, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/844,620

(22) Filed: Jul. 27, 2010

(65) Prior Publication Data

US 2011/0032009 A1 Feb. 10, 2011

(30) Foreign Application Priority Data

Aug. 4, 2009 (JP) .................................. 2009-181966
Jul. 22, 2010 (JP) .................................. 2010-165346

(51) Int. Cl.
*H03L 7/06* (2006.01)

(52) U.S. Cl. .......................... 327/158; 327/149; 327/161

(58) Field of Classification Search .................. 327/149, 327/158, 161
See application file for complete search history.

(56) References Cited

U.S. PATENT DOCUMENTS

| | | | |
|---|---|---|---|
| 5,994,934 A | 11/1999 | Yoshimura et al. | |
| 6,239,634 B1 * | 5/2001 | McDonagh | 327/158 |
| 7,019,573 B2 | 3/2006 | Matsuno | |
| 7,482,850 B2 | 1/2009 | Kawamoto | |
| 7,733,138 B2 * | 6/2010 | Uehara et al. | 327/158 |
| 7,893,725 B2 * | 2/2011 | Mai | 327/12 |

FOREIGN PATENT DOCUMENTS

| | | |
|---|---|---|
| JP | 11-205102 A | 7/1999 |
| JP | 2005-20711 A | 1/2005 |
| JP | 2007-243877 A | 9/2007 |

* cited by examiner

*Primary Examiner* — Hai L Nguyen
(74) *Attorney, Agent, or Firm* — Fitzpatrick, Cella, Harper & Scinto

(57) ABSTRACT

A delay locked loop circuit comprising a VCDL which outputs a feedback clock by delaying an input clock in accordance with a magnitude of a control voltage, a phase comparator which detects a phase difference between the feedback clock and a reference clock by comparing the feedback clock with the reference clock, and outputs an Up-signal for raising the control voltage and a Down-signal for lowering the control voltage in accordance with the phase difference, a control voltage generation circuit which determines the control voltage in accordance with the Up-signal and the Down-signal, and outputs the control voltage to the VCDL, and a reset circuit which resets the phase comparator based on a logical OR between the reference clock and a first intermediate clock which is a signal obtained by delaying the input clock by the VCDL and is output before the feedback clock.

12 Claims, 18 Drawing Sheets

FIG. 5A  AT TIME OF ESCAPE FROM LOSS-OF-LOCK STATE TO NORMAL STATE
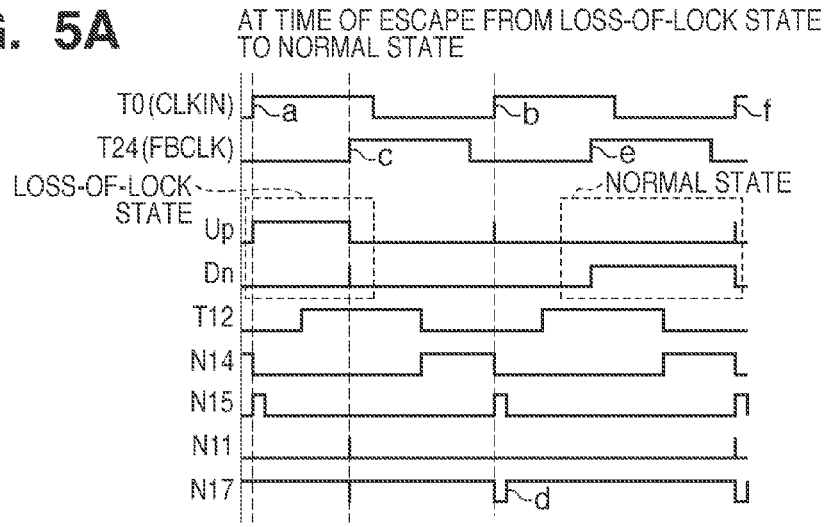
FIG. 5B  WHEN LOCKED
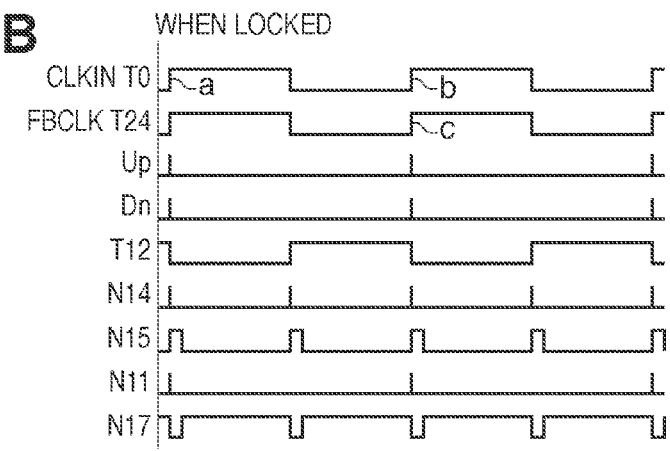
FIG. 5C  OPERATION PERFORMED WHEN FEEDBACK CLOCK FBCLK DELAYS FROM REFERENCE CLOCK CLKIN
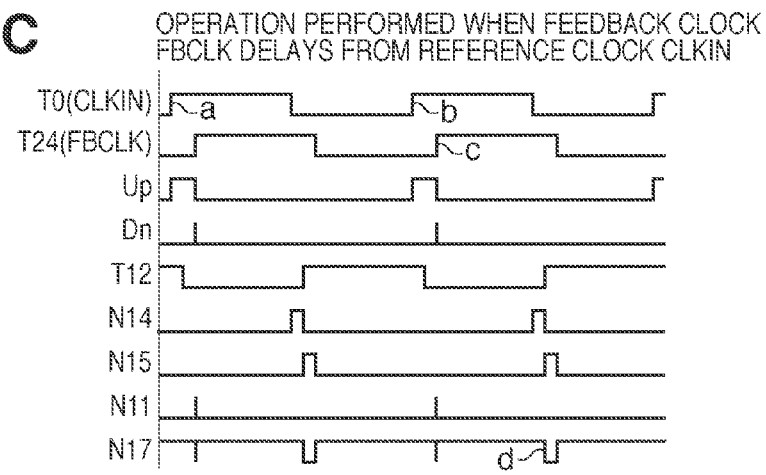

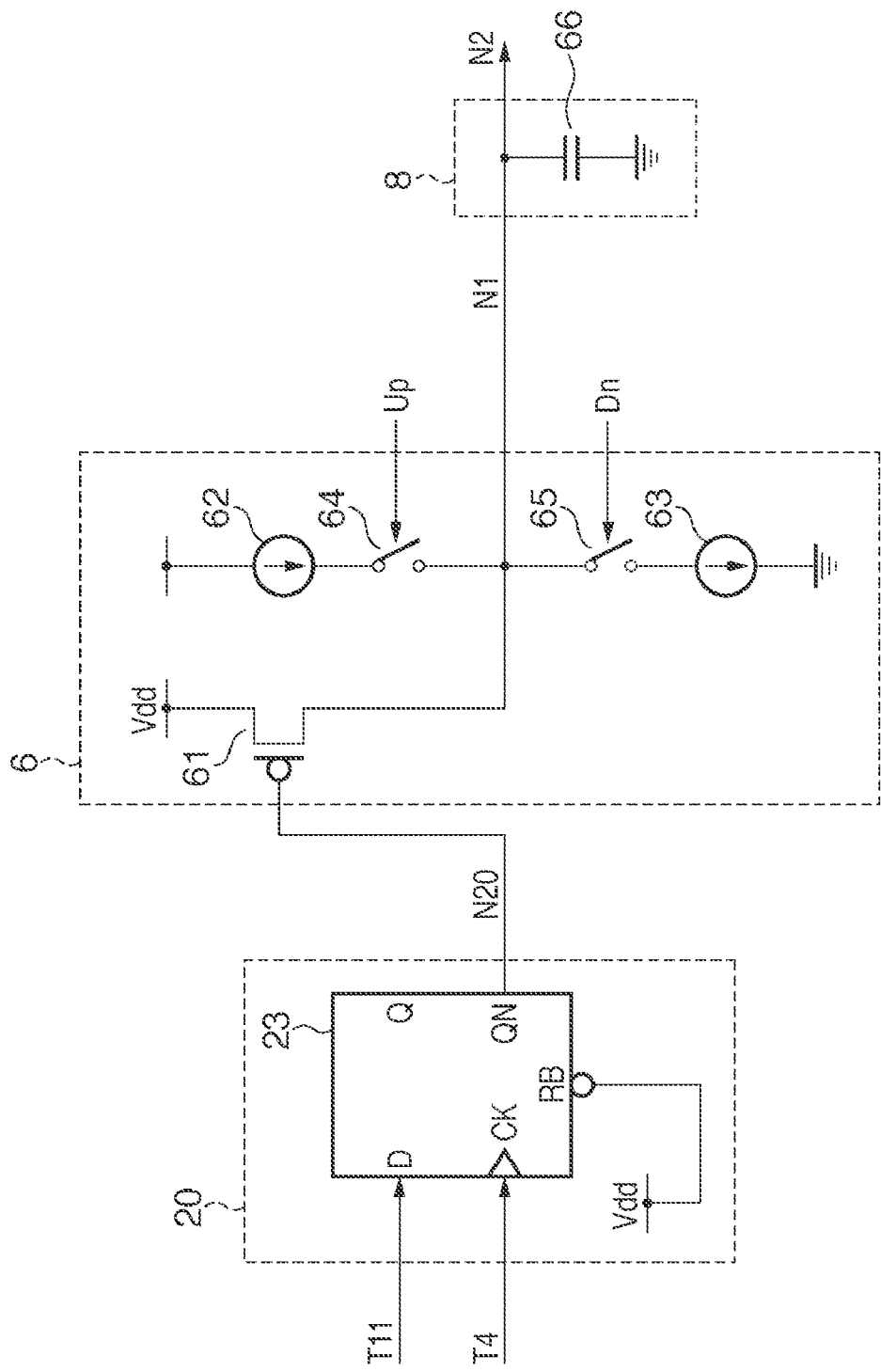

WHEN NORMALLY LOCKED

AT OCCURRENCE OF PSEUDO-LOCK WITH DELAY OF ONE PERIOD

AT OCCURRENCE OF PSEUDO-LOCK WITH DELAY OF TWO PERIODS

AT TIME OF ESCAPE FROM LOSS-OF-LOCK STATE TO NORMAL STATE

WHEN LOCKED

F I G. 16A  AT TIME OF ESCAPE FROM LOSS-OF-LOCK STATE TO NORMAL STATE
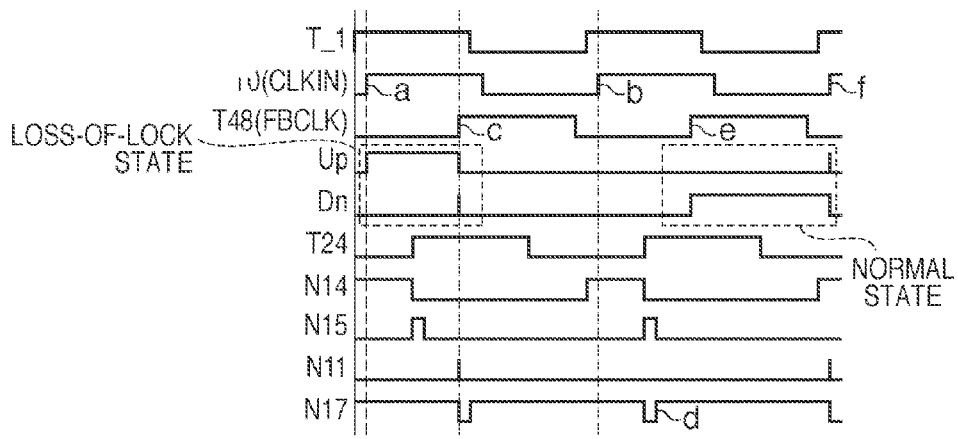
F I G. 16B  WHEN LOCKED
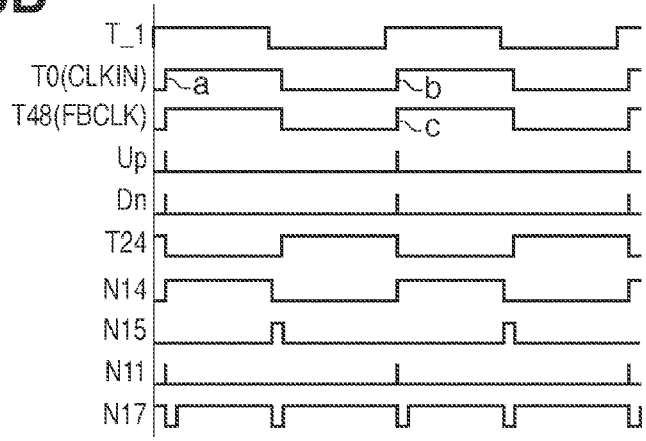
F I G. 16C  OPERATION PERFORMED WHEN FEEDBACK CLOCK FBCLK DELAYS FROM REFERENCE CLOCK CLKIN
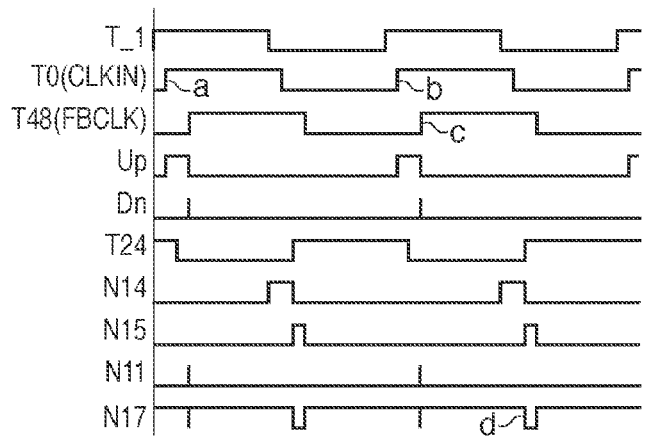

WHEN NORMALLY LOCKED

AT OCCURRENCE OF PSEUDO-LOCK WITH DELAY OF ONE PERIOD

DELAY LOCKED LOOP CIRCUIT

BACKGROUND OF THE INVENTION

1. Field of the Invention

The present invention relates to a delay locked loop circuit used for clock synchronization, multiphase clock generation, multiplication, and the like and, more particularly, to a technique of preventing the loss-of-lock state of a delay locked loop circuit.

2. Description of the Related Art

A delay locked loop circuit (to be abbreviated as a DLL circuit hereinafter) is a circuit for synchronizing the feedback clock output from a voltage controlled delay line (to be abbreviated as a VCDL hereinafter) with a reference clock delayed by one clock in order to establish clock synchronization in a semiconductor integrated circuit chip. Typical malfunctions of a DLL circuit include pseudo-lock and loss of lock. Pseudo-lock is a state in which a feedback clock synchronizes with a reference clock delayed by two or more clocks. The occurrence of pseudo-lock disables multiphase clock generation and multiplication. Japanese Patent Laid-Open No. 2005-020711 discloses a technique of preventing this pseudo-lock.

Loss of lock is a malfunction that causes a DLL circuit to synchronize a reference clock with a feedback clock delayed by 0 clock from the reference clock. Loss of lock will be described with reference to FIG. 13. Referring to FIG. 13, reference symbol CLKIN denotes a reference clock; FBCLK, a feedback clock; Up, an Up-signal from a phase comparator which is used to raise the charge pump (to be abbreviated as CP) output; and Dn, a Down-signal from the phase comparator which is used to lower the CP output. The CP raises and lowers the output voltage in accordance with the difference between the pulse width (the temporal width of a pulse) of the Up-signal Up and that of the Down-signal Dn.

In the DLL circuit, the normal operation of the phase comparator is to phase-compare a leading edge b of the second pulse of the reference clock CLKIN with a leading edge c of the first pulse of the feedback clock FBCLK. When the power is turned on or an external clock signal is disturbed, the phase comparator may phase-compare a leading edge a of the first pulse of the reference clock CLKIN with a leading edge c of the first pulse of the feedback clock FBCLK. This is loss of lock.

In this case, the phase comparator determines that the feedback clock FBCLK is delayed from the reference clock CLKIN. For this reason, the pulse width of the Up-signal Up becomes larger than that of the Down-signal Dn, and the control voltage rises to the highest voltage that the charge pump CP can output. The delay time of the feedback clock FBCLK is fixed to the minimum delay time of the VCDL. However, this fixed state varies in delay time with variations in temperature, variations in power supply voltage, manufacturing variations, and the like, and hence differs from a locked state. This increases the jitter of the feedback clock. That is, the incorporation of the DLL circuit in the chip loses its meaning. For this reason, the DLL circuit preferably incorporates a mechanism for preventing loss of lock. As this mechanism for preventing loss of lock, the methods disclosed in Japanese Patent Laid-Open Nos. 2007-243877 and 11-205102 will be described.

The method disclosed in Japanese Patent Laid-Open No. 2007-243877 uses a DLL circuit and a counter control circuit (CNT). A counter control circuit (CNT) 2 receives a reference clock CLKIN, and outputs a control signal S to activate a DLL circuit 1 after counting one clock. This makes it possible to phase-compare an edge b of the reference clock CLKIN and an edge c of the feedback clock FBCLK in FIG. 13, thereby preventing loss of lock.

The mechanism for preventing loss of lock in Japanese Patent Laid-Open No. 11-205102 makes the voltage of the output line of a low-pass filter (LPF) for low-pass filtering an output from a charge pump circuit higher than an intermediate voltage VR at the occurrence of loss of lock. Therefore, this mechanism compares the voltage of the output line with the intermediate voltage VR by using a voltage comparator. If the voltage of the output line is higher than the intermediate voltage VR, the mechanism outputs a reset signal RST. This resets the phase comparator and the LPF, thereby preventing loss of lock.

The method of preventing loss of lock by using a counter disclosed in Japanese Patent Laid-Open No. 2007-243877 is effective if a VCDL operates in the described manner when the power of a semiconductor integrated circuit chip is turned on. Loss of lock also occurs when an external clock signal is disturbed. In this case, the counter control circuit 2 loses its meaning, and hence the method disclosed in Japanese Patent Laid-Open No. 2007-243877 cannot escape from loss of lock. In general, a DLL circuit includes a pseudo-lock detection circuit. However, this method cannot prevent loss of lock when the pseudo-lock detection circuit detects pseudo-lock and restores the DLL circuit to the initial state. In addition, when the power of the semiconductor integrated circuit is turned on, the potential at an inverter control node in the VCDL is unstable, and hence the VCDL outputs an unintentional clock. For this reason, it is also sometimes impossible to prevent loss of lock when the power is turned on.

The method disclosed in Japanese Patent Laid-Open No. 11-205102 requires a voltage comparator as an analog circuit and an intermediate voltage VR input to the voltage comparator for the detection of loss of lock. The voltage comparator requires a large area for layout because it is an analog circuit, and hence has a large circuit size and consumes higher power than a logic circuit. This comparator requires a resistor or capacitor to generate the intermediate voltage VR. This also makes it necessary for the comparator to have a large area for layout. In addition, in order to reset a phase comparator 3 at a proper timing, a complex circuit is required.

SUMMARY OF THE INVENTION

Therefore, there is provided a DLL circuit having a compact layout which can reliably prevent loss of lock in either of the cases in which an eternal clock signal is disturbed, pseudo-lock is detected and initialization is performed, and the power is turned on.

One type of a delay locked loop circuit is provided which comprises a voltage controlled delay line (VCDL) which outputs a feedback clock by delaying an input clock in accordance with a magnitude of a control voltage, a phase comparator which detects a phase difference between the feedback clock and a reference clock by comparing the feedback clock with the reference clock, and outputs an Up-signal for raising the control voltage and a Down-signal for lowering the control voltage in accordance with the phase difference, a control voltage generation circuit which determines the control voltage in accordance with the Up-signal and the Down-signal, and outputs the control voltage to the voltage controlled delay line, and a reset circuit which resets the phase comparator based on a logical OR between the reference clock and a first intermediate clock which is a signal obtained by delaying the input clock by the voltage controlled delay line and is output before the feedback clock.

Another type of a delay locked loop circuit is also provided which comprises a voltage controlled delay line (VCDL) which outputs a reference clock and a feedback clock by delaying an input clock in accordance with a magnitude of a control voltage, a phase comparator which detects a phase difference between the reference clock and the feedback clock by comparing the feedback clock with the reference clock, and outputs an Up-signal for raising the control voltage and a Down-signal for lowering the control voltage in accordance with the phase difference, a control voltage generation circuit which determines the control voltage in accordance with the Up-signal and the Down-signal, and outputs the control voltage to the voltage controlled delay line and, a reset circuit which resets the phase comparator based on an logical OR between the input clock and a first intermediate clock which is a signal obtained by delaying the input clock by the voltage controlled delay line and is output before the feedback clock.

Further features of the present invention will become apparent from the following description of exemplary embodiments (with reference to the attached drawings).

BRIEF DESCRIPTION OF THE DRAWINGS

FIGS. 5A to 5C are operation timing charts in the first embodiment;

FIG. 6 is a circuit diagram showing an example of the circuit arrangement of a pseudo-lock detection circuit 20, CP 6, and LPF 8 according to the first embodiment;

FIGS. 16A to 16C are operation timing charts in the fifth embodiment;

DESCRIPTION OF THE EMBODIMENTS

The embodiments of the present invention will be described below with reference to the accompanying drawings.

First Embodiment

The first embodiment is configured to make a VCDL output an intermediate clock having a delay time of ½ a feedback clock, operate the logical OR between a reference clock and the intermediate clock to detect the trailing edge of a pulse of the logical OR output, and generate a reset signal for a phase comparator.

Figure 1:
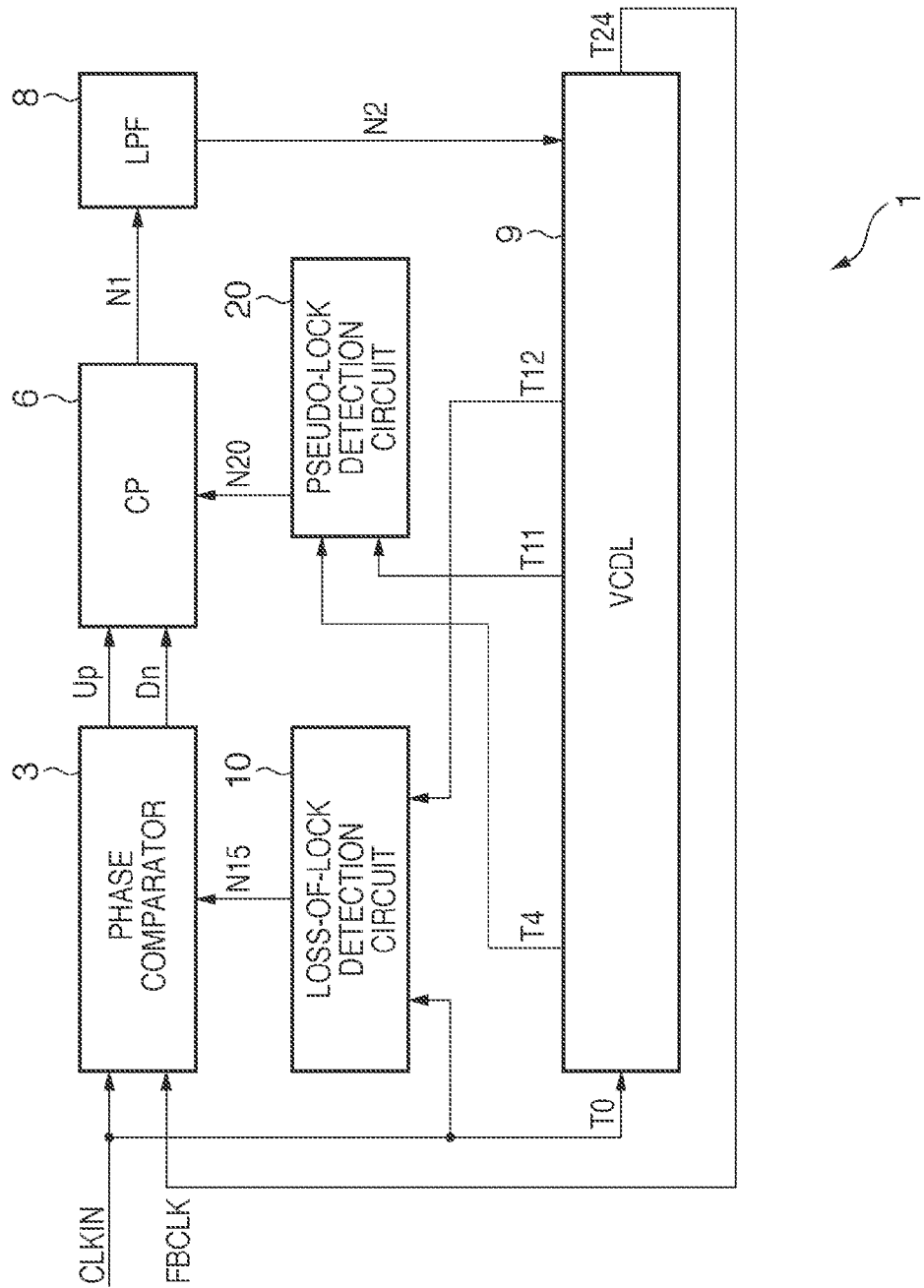
FIG. 1 is a block diagram showing an example of the arrangement of a DLL circuit according to the first embodiment.

FIG. 1 is an overall block diagram of a delay locked loop circuit (DLL circuit) 1 according to the first embodiment. Reference symbol N1 denotes an output node from a CP 6 which is input to a low-pass filter (LPF) 8; and N2, an output node from the LPF 8 to which the control voltage of a voltage controlled delay line (VCDL) 9 is input. A phase comparator 3 compares the leading edge of the second pulse of a reference clock CLKIN with the leading edge of the first pulse of a feedback clock FBCLK. Reference symbol Up denotes a node from which the phase comparator 3 outputs an Up-signal to raise the voltage at the output node N1 of the CP 6; and Dn, a node from which the phase comparator 3 outputs a Down-signal to lower the voltage at the output node N1 of the CP 6.

The VCDL 9 receives the reference clock CLKIN at an input node T0 and outputs the feedback clock FBCLK from a node T24 via 24 internal unit delay elements. In this case, the node T24 is an output from the 24th delay element. The VCDL 9 is designed to shorten the delay time of the feedback clock FBCLK relative to the reference clock CLKIN as the voltage of the output node N2 increases. The VCDL 9 further outputs an intermediate clock (first intermediate clock) from a node T12 to a loss-of-lock detection circuit 10. The node T12 is an output from the 12th delay element. The VCDL 9 also outputs intermediate clocks (second and third intermediate clocks) from a node T4 and a node T11 to a pseudo-lock detection circuit 20. The nodes T4 and T11 are outputs from the fourth and 11th delay elements, respectively.

The loss-of-lock detection circuit 10 functions as a reset circuit to generate a reset signal from the reference clock CLKIN at the node T0 and the intermediate clock at the node T12, and can reset the phase comparator 3 via a node N15. A pseudo-lock detection circuit 20 generates a reset signal from the second and third intermediate clocks at the nodes T4 and t11, and can reset the CP 6 via a node N20.

Figure 2:
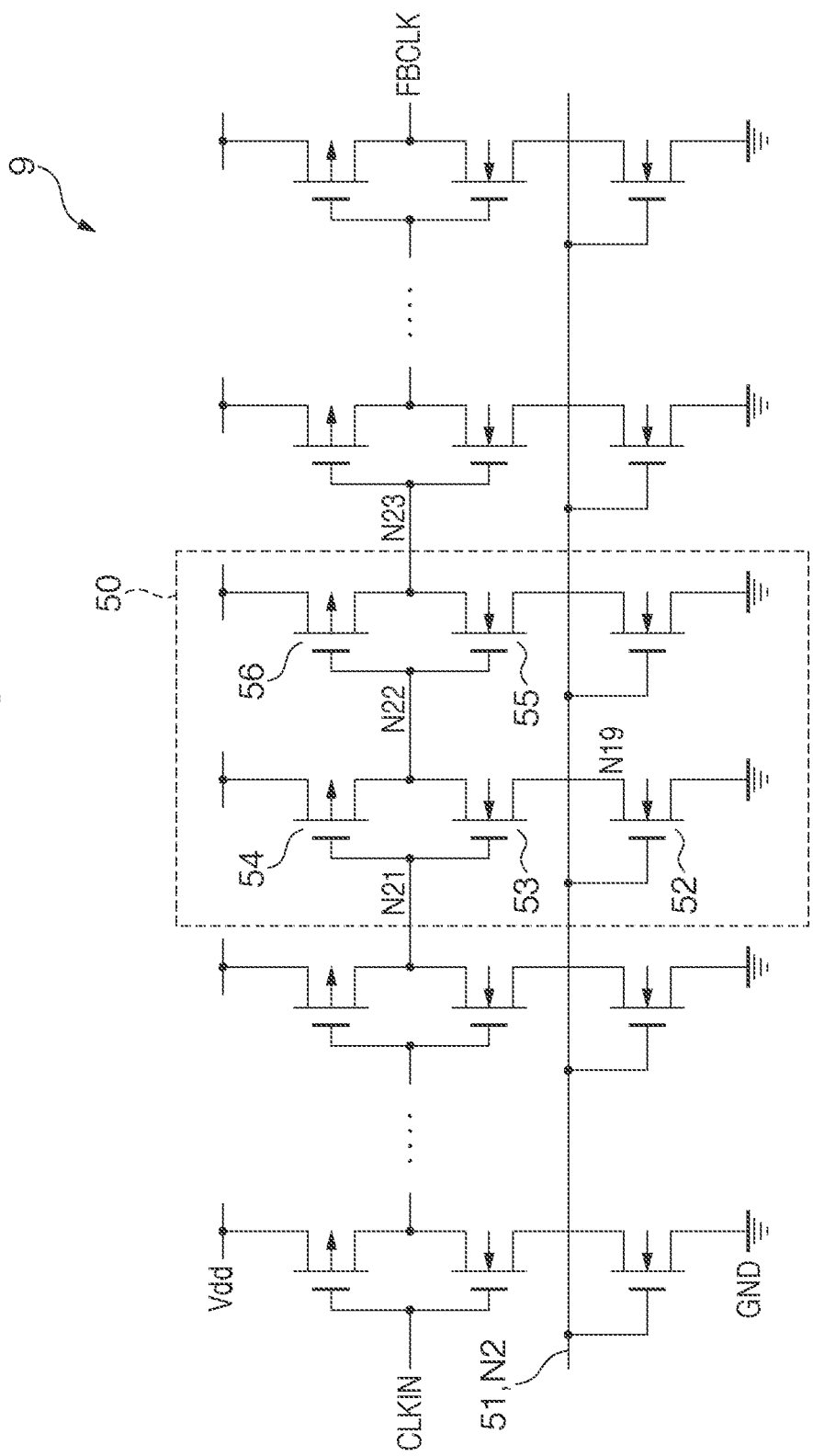
FIG. 2 is a circuit diagram showing an example of the circuit arrangement of a VCDL 9 according to the first embodiment.

FIG. 2 shows the internal circuit of the block of the VCDL 9. Delay control by the VCDL 9 will be described. Referring to FIG. 2, reference numeral 50 denotes a unit delay element; 51, a control voltage node; 52, an n-channel MOS transistor forming a constant current source; 53 and 55, n-channel MOS transistors forming an inverter; and 54 and 56, p-channel MOS transistors forming an inverter. An re-channel MOS transistor and a p-channel MOS transistor will be abbreviated as an nMOS and pMOS, respectively, hereinafter.

When the voltage at a common gate N21 of the nMOS 53 and pMOS 54 constituting the inverter changes from Gnd (for example, 0 V) to Vdd (for example, 1.8 V), the voltage at an output node N22 of the inverter changes from Vdd to Gnd. Note that N22 is the common drain of the nMOS 53 and pMOS 54. This is because, while the pMOS 54 is switched from the ON state to the OFF state to disconnect N22 from Vdd, the nMOS 53 is switched from the OFF state to the ON state to connect N22 to Gnd via the nMOS 53 and nMOS 52. At this switching timing, electrons flow from the source (Gnd) of the nMOS 52 to the parasitic capacitance of N22 via N19 (the common node of the drain of the nMOS 52 and source of the nMOS 53). The electrons are stored in the parasitic capacitance.

Changing the voltage at the control voltage node 51 will control the current to be supplied from the nMOS 52 forming a constant current source. That is, decreasing the voltage at the control voltage node 51 will decrease the number of electrons flowing from the source of the nMOS 52 to the drain N19. In this case, even if the nMOS 53 is on, the number of electrons flowing into the parasitic capacitance of N22 is small. This increases the trailing edge delay by which the voltage at the output node N22 of the inverter (nMOS 53 and pMOS 54) changes from Vdd to Gnd. Likewise, it is possible to increase the trailing edge delay of an inverter (nMOS 55 and pMOS 56) output N23. This controls the pulse delay at the output node N23 of the unit delay element 50 relative to the input node N21 so as to keep both the leading edge timing and the trailing edge timing constant. That is, the unit delay element 50 can delay a pulse at the output node N23 by a controlled delay time while keeping the duty ratio (the ratio of a Vdd interval to one signal period) between a pulse at the input N21 and a pulse at the output N23 constant.

The VCDL 9 in the first embodiment shown in FIG. 2 is called nMOS current starved VCDL. As shown in FIG. 1, the output node N2 from the LPF 8 controls the delay time of the VCDL 9. That is, the node N2 is connected to the control voltage node 51 in FIG. 3.

The VCDL 9 in the first embodiment is configured such that 24 unit delay elements 50 are arranged between the reference clock CLKIN and the feedback clock FBCLK. The VCDL 9 can output an intermediate clock from the output node T12 of the 12th unit delay element to the outside of the block, that is, the loss-of-lock detection circuit 10. The VCDL 9 can output the second and third intermediate clocks from output nodes T4 and T11 of the fourth and 11th unit delay elements to the outside of the block, that is, the pseudo-lock detection circuit 20.

Figure 3:
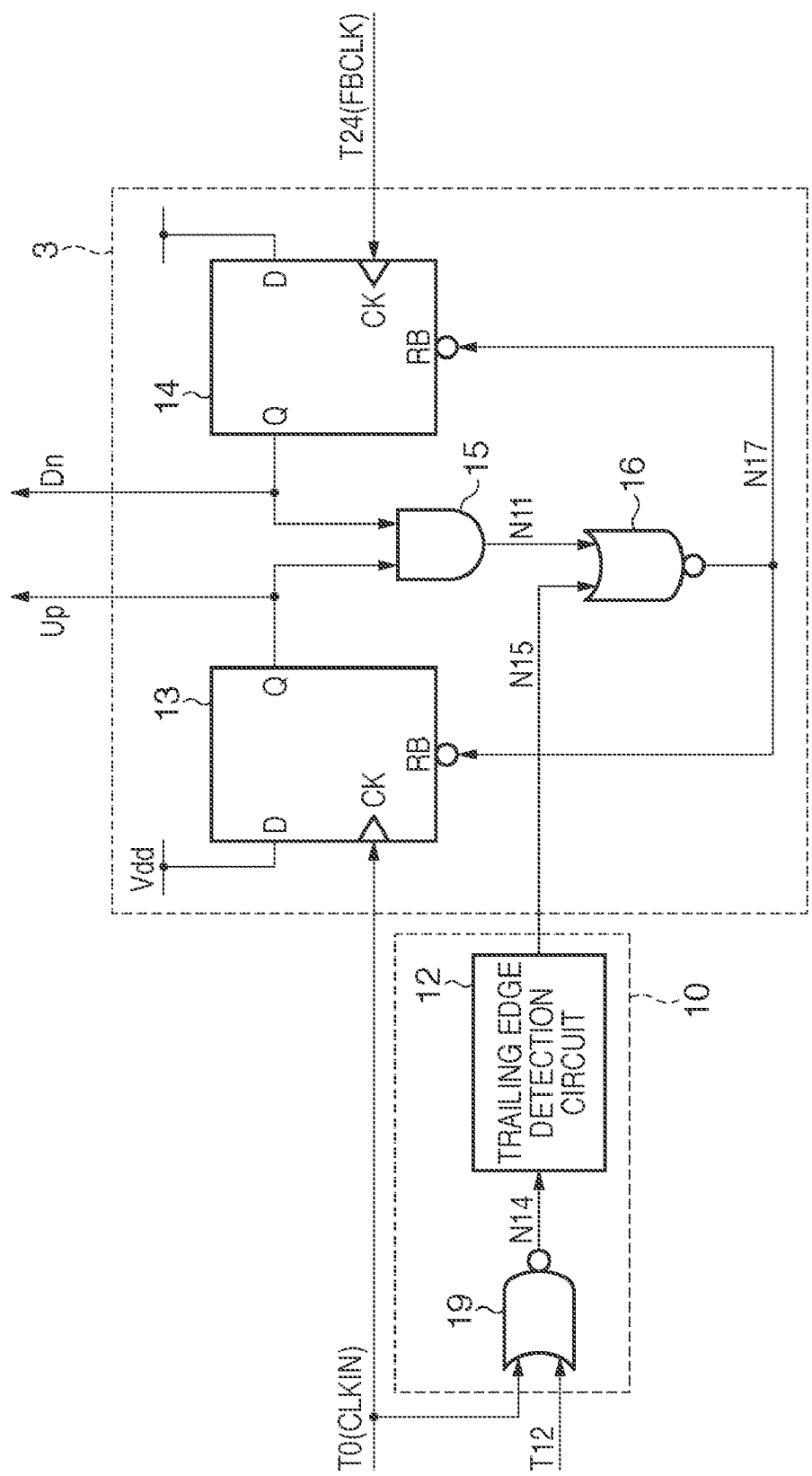
FIG. 3 is a block diagram showing an example of the circuit arrangement of a phase comparator 3 and loss-of-lock detection circuit 10 according to the first embodiment.

FIG. 3 shows the internal circuits of the blocks of the phase comparator 3 and loss-of-lock detection circuit 10 in FIG. 1. Referring to FIG. 3, reference numeral 12 denotes a trailing edge detection circuit; 13 and 14, leading edge trigger type D flip-flops (to be abbreviated as DFFs hereinafter); 15, an AND gate; and 16 and 19, NOR gates. The same reference numerals as those of the members described above denote the same members. The loss-of-lock detection circuit 10 includes the NOR gate 19 and the trailing edge detection circuit 12. The NOR gate 19 includes the nodes T12 and T0 as input nodes, and a node N14 as an output node. That is, the NOR gate 19 is configured to operate the logical OR between the first intermediate clock at the node T12 with a delay time of ½ the node T24 and the reference clock at the node T0 and invert the output. This output is a pulse at the node N14. The trailing edge detection circuit 12 receives the pulse at the node N14 and detects the trailing edge of the pulse at N14 to output a short pulse.

The phase comparator 3 in FIG. 3 includes the DFFs 13 and 14, AND gate 15, and NOR gate 16. If the DFFs 13 and 14 each are in the set state upon application of the Vdd potential at the RB node, the potential at the D node is output to the Q node at the leading edge of a pulse at the CK node. Since the D node of each of the DFFs 13 and 14 is fixed to the Vdd potential, each DFF outputs the Vdd potential from the Q node at the leading edge of a pulse at the CK node. In addition, when the Gnd potential is applied to the RB node, each of the DFFs 13 and 14 is reset to output the Gnd potential from the Q node. Since the DFFs 13 and 14 are based on static logic, the phase comparator 3 is also based on static logic.

Figure 4:
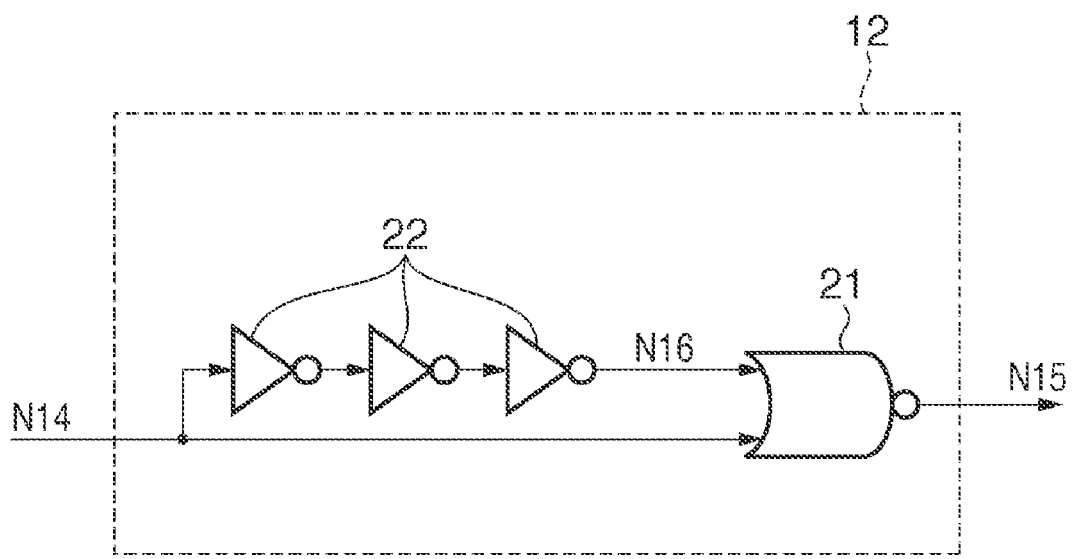
FIG. 4 is a view showing an example of the circuit arrangement of a trailing edge detection circuit 12 according to the first embodiment.

FIG. 4 is a detailed circuit diagram of the trailing edge detection circuit 12 in FIG. 3. Referring to FIG. 4, reference numeral 21 denotes a NOR gate; and 22, a three-stage inverter. Reference symbol N16 denotes an output node of the three-stage inverter 22. The three-stage inverter 22 outputs an inverted pulse with a delay from the node N14 to the node N16. NORing signals on N14 and N16 at the NOR gate 21 will output, to N15, a pulse which has a pulse width corresponding to the delay time of the three-stage inverter 22 and is obtained upon detection of the trailing edge of a pulse at N14. The three-stage inverter 22 may include an odd number of stages, and the number of stages may be selected to transmit a short pulse output at N15 to the subsequent stage of the trailing edge detection circuit 12.

FIGS. 5A to 5C are operation timing charts at the time of escape from a loss-of-lock state to a normal state. The operations of the phase comparator 3 and loss-of-lock detection circuit 10 in FIG. 3 will be described with reference to FIGS. 5A to 5C. Referring to FIGS. 5A to 5C, T0, T24, Up, Dn, T12, N14, N15, N11, and N17 denote voltage waveforms at the respective nodes in FIG. 3. As shown in FIG. 5A, when the reference clock CLKIN and the feedback clock FBCLK are input to T0 and T24, the phase comparator 3 should operate to make a leading edge b of the reference clock coincide with a leading edge c of the feedback clock. At the earlier part of timing in FIG. 5A, the phase comparator 3 malfunctions to output a signal pulse in a loss-of-lock state as indicated by the enclosed dotted line. This loss of lock occurs when the power is turned on or an external clock is disturbed or when initialization is performed upon detection of pseudo-lock (the delay time is minimized).

The process of escaping from this loss-of-lock state to the normal state will be described next. As shown in FIG. 5A, the NOR gate 19 outputs a pulse like N14. The trailing edge detection circuit 12 then outputs a short pulse upon detection of the trailing edge of the pulse at N14, as indicated by the waveform at N15. The NOR gate 16 in FIG. 3 receives the pulse at the node N15 generated in this manner, and outputs a reset pulse like that indicated by d at N17 in FIG. 5A. The reset pulse like that indicated by d at N17 then resets the DFFs 13 and 14. As a consequence, the leading edge of a pulse of the feedback clock at T24 like that indicated by e in FIG. 5A is detected, and the Q node of the DFF 14 in FIG. 3 is set to the Vdd potential. The Q node of the DFF 14 is kept at the Vdd potential until the Q node of the DFF 13 is set to the Vdd potential at the leading edge of the reference clock at T0 like that indicated by f. Thereafter, the Q node is set to the Gnd potential. As a result, a Down-signal is output to the Dn node of the phase comparator 3 connected to the Q node of the DFF 14 in the interval between times e and f. This gradually delays the feedback clock FBCLK output to T24. That is, this circuit has escaped from the loss-of-lock state and returned to the normal state.

Outputting normal Up- and Down-signals to the Up and Dn nodes of the phase comparator 3 in this manner will lower the potentials at N1 and N2 in FIG. 1 and gradually increase the delay time of the feedback clock (T24) relative to the reference clock (T0). When the delay time of the feedback clock (T24) relative to the reference clock (T0) coincides with one period, a DLL circuit 1 is locked.

FIG. 5B shows pulses at the respective nodes of the DLL circuit 1 when it is locked. When this circuit is locked, the reference clock (T0) shifts from the first intermediate clock (T12) by just half period. As a result, as indicated by N14 in FIG. 5B, short pulses may appear at the leading and trailing edges of the reference clock (T0) and first intermediate clock (T12). However, since the pulses at N15 and N17 in FIG. 5B obtained upon detection of the short pulses reset the DFFs 13 and 14 at the timings when the Up- and Down-signals at the Up and Dn nodes do not appear, the phase comparator 3 keeps normally operating.

FIG. 5C is a timing chart representing operation performed when the feedback clock FBCLK delays from the reference clock CLKIN. This state can occur when the power supply fluctuates or the externally input reference clock is disturbed. In this case, this circuit operates to make a leading edge c of the feedback clock FBCLK coincide with a leading edge b of the reference clock CLKIN in FIG. 5C. That is, the CP 6 makes the pulse width of the Up-signal Up larger than that of the Down-signal Dn to shorten the delay time of the VCDL 9. The NOR gate 19 outputs a pulse like that shown in FIG. 5C at the node N14 from the reference clocks (T0) and the intermediate clock (T12). As a result, a pulse rises at the node N15 upon detection of the trailing edge of a pulse at N14. The NOR gate 16 sets the node N17 to the Gnd potential at time d to reset the DFFs 13 and 14. During this time, however, both the Up-signal Up and the Down-signal Dn are at Gnd, and hence there is no influence on the pulse width that sets the Up-signal Up and the Down-signal Dn to the Vdd potential. For this reason, after a given period of time, the DLL circuit 1 of the first embodiment reaches a locked state, as shown in FIG. 5B.

FIG. 6 is a circuit diagram of the pseudo-lock detection circuit 20, CP 6, and LPF 8. The pseudo-lock detection circuit 20, CP 6, and LPF 8 in FIG. 1 will be described with reference to FIG. 6. The pseudo-lock detection circuit 20 includes a leading edge trigger D flip-flop (to be abbreviated as a DFF hereinafter) 23. The CP 6 includes a pMOS 61, constant current sources 62 and 63, and switches 64 and 65. The LPF 8 includes a capacitor 66. The CP 6 and the LPF 8 determine a control voltage for the VCDL 9 in accordance with Up- and Down-signals. More specifically, when an Up-signal is input to the Up node, the switch 64 is kept on during this period, and the constant current source 62 supplies a constant current to the capacitor 66. As a consequence, the potentials at the output node N1 of the CP 6 and the output node N2 of the LPF increase. As a result, the delay time of the VCDL 9 decreases. When a Down-signal comes to the Dn terminal, the switch 65 is turned on to make the constant current source 63 remove a constant current from the capacitor 66. The potentials at N1 and N2 then decrease. As a result, the delay time of the VCDL 9 increases. When a locked state is set, the pulse widths of the Up- and Down-signals become the same, and the ON times of the switches 64 and 65 become the same. As a consequence, the potentials at the nodes N1 and N2 are fixed. In this case, the capacitor 66 also functions as the LPF 8 to remove high-frequency noise.

Figure 7A:
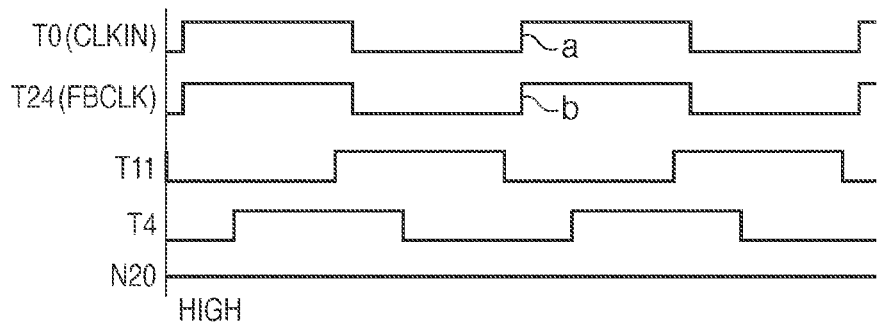
FIGS. 7A to 7C are timing charts for explaining pseudo-lock releasing operation in the first embodiment.
Figure 7B:
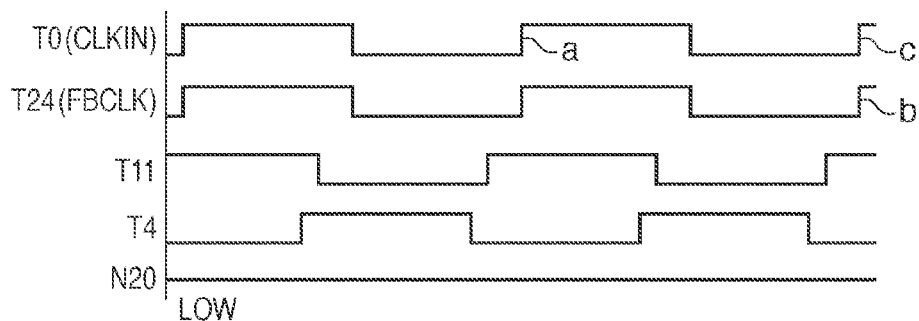
Figure 7C:
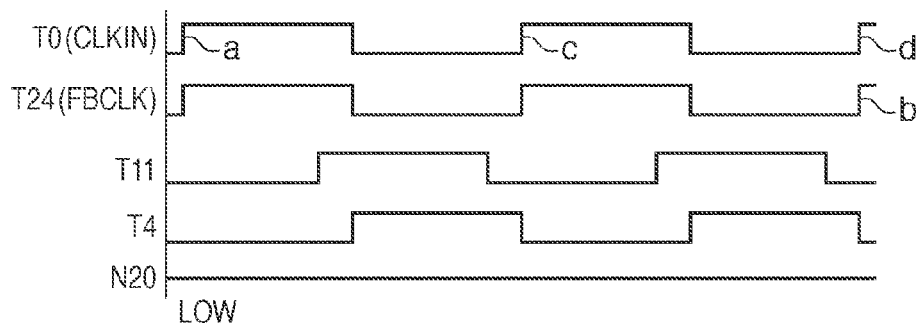

The pseudo-lock detection circuit 20 includes a DFF 23. The third and second intermediate clocks T11 and T4 are input to the D and CK nodes of the DFF 23, respectively. An output from the QN node of the DFF 23 is then connected to the gate of the pMOS 61 of the CP 6. FIGS. 7A to 7C are timing charts associated with the pseudo-lock detection circuit 20. FIG. 7A shows voltage waveforms of T0, T24, T11, T4, and N20 in a normal locked state. At this time, leading edges a and b of T0 and T24 coincide with each other, and T11 (D node) is at the Gnd potential at the leading edge of a pulse of T4 (CK node). The DFF 23 in FIG. 6 is in a set state upon application of the Vdd potential to the RB node, and hence the DFF 23 outputs the potential at the D node at the leading edge of a pulse at the CK node to the Q node. On the other hand, the DFF 23 outputs an inverse signal at the Q node to the QN node. Therefore, N20 is always at the Vdd potential, and the pMOS 61 of the CP 6 is kept off. The potentials at N1 and N2 are kept at the potential set when the DLL circuit 1 is locked.

FIG. 7B is a timing chart in a case in which pseudo-lock with a delay of one period occurs. Although the leading edges a and b of T0 and T24 should be locked, a leading edge c delayed from the leading edge a of T0 by one period and the leading edge b of T24 are locked, resulting in a pseudo-lock state. In this case, at the leading edge of the pulse of T4 (CK node), T11 (D node) is at the Vdd potential. For this reason, N20 (QN node) is set at the Gnd potential, and the pMOS 61 in the CP 6 is turned on to raise the potentials at N1 and N2 to the Vdd potential. As a result, the delay time of the VCDL 9 is minimized, and the DLL circuit 1 is restored to the initial state.

FIG. 7C shows a case in which pseudo-lock with a delay of two periods has occurred. Although leading edges a and b of T0 and T24 should be locked, a leading edge d delayed from the leading edge a of T0 by two periods and the leading edge b of T24 are locked. In this case, T11 (D node) is at the Vdd potential at the leading edge of the pulse of T4 (CK node). For this reason, N20 (QN node) is set at the Gnd potential, and the pMOS 61 is turned on to raise the potentials of N1 and N2 to the Vdd potential. As a result, the delay time of the VCDL 9 is minimized, and the DLL circuit 1 is restored to the initial state.

In this manner, when the second intermediate clock T4 rises at the leading edge (ON state) of the third intermediate clock T11, the pseudo-lock detection circuit 20 sets N20 as an initialization signal to the Gnd potential. With this operation, the pseudo-lock detection circuit 20 functions as an initialization circuit to initialize the delay time of the VCDL 9 via the CP 6. The CP 6 initializes the control voltage by setting it to the maximum value (Vdd potential), which it has in accordance with the input of the initialization signal. The above is a description of the pseudo-lock detection circuit.

The loss-of-lock prevention method according to the first embodiment can prevent loss of lock even when the DLL circuit 1 is restored to the initial state upon detection of pseudo-lock. This is because, the loss-of-lock detection circuit 10 according to the first embodiment allows restoration from the loss-of-lock state to the normal state by resetting the phase comparator 3 when the DLL circuit 1 is in a loss-of-lock state.

Modification of First Embodiment

According to the above description, in the first embodiment, the VCDL includes 24 unit delay elements, and the phase comparator compares the clock at the input node T0 as a reference clock with the clock at the output node T24 as a feedback clock. However, the number of unit delay elements of the VCDL is arbitrarily set. In addition, it is possible to arbitrarily select output clocks from the VCDL which the phase comparator compares with each other. A reference clock need not be identical to an input clock to the VCDL, and may be an intermediate clock from the VCDL. In addition, according to the above description, in the first embodiment, the loss-of-lock detection circuit receives a reference clock and an intermediate clock having a delay time ½ the delay time of a feedback clock relative to the reference clock and calculates the logical OR between them. However, this circuit need not strictly use a reference clock, and may use a clock nearby the reference clock. In addition, the intermediate clock to be used need not strictly be an intermediate clock having a delay time of ½, and a nearby clock may be picked up. If the delay time of the feedback clock relative to the reference clock is 1, a clock nearby the reference clock is a clock having a delay time within ±⅕ the delay time. In addition, the intermediate clock is preferably a clock having a delay time within ½±⅕the delay time.

The first embodiment has been described assuming that the VCDL is an nMOS current starved VCDL like that shown in FIG. 2. However, the present invention can be applied to any types of VCDLs including a pMOS current starved VCDL, nMOS-pMOS current starved VCDL, and fully differential VCDL.

Second Embodiment

A loss-of-lock detection circuit according to the second embodiment omits the trailing edge detection circuit 12 from the first embodiment. The overall block diagram of a DLL circuit in the second embodiment is the same as that shown in FIG. 1 in the first embodiment except that the trailing edge detection circuit 12 is omitted. The second embodiment does not include the trailing edge detection circuit 12, and hence an output N15 of a NOR gate 19 is directly connected to an input of a NOR gate 16. For this reason, the circuit of the second embodiment is more compact than that of the first embodiment.

Figure 8A:
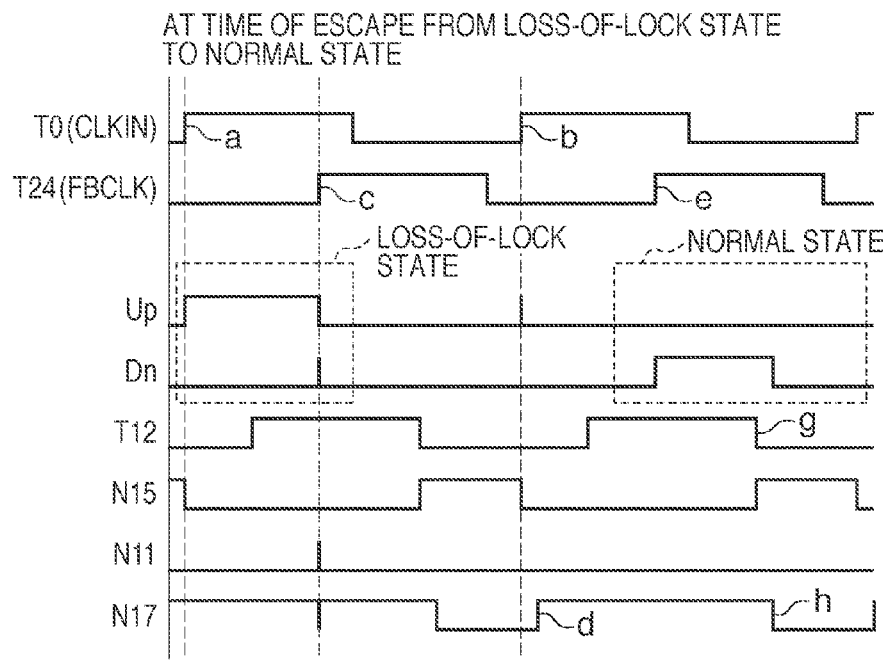
FIGS. 8A and 8B are operation timing charts for explaining releasing of a loss-of-lock state according to the second embodiment.

The operation of the second embodiment will be described with reference to the timing charts of FIGS. 8A and 8B. FIG. 8A shows operation at the time of escape from a loss-of-lock state to a normal state. T0, T24, Up, Dn, T12, N15, N11, and N17 in the timing chart denote voltage waveforms at the respective nodes in FIG. 3. As shown in FIG. 8A, when a reference clock CLKIN and a feedback clock FBCLK are input to T0 and T24, a phase comparator 3 should operate to make a leading edge b of the reference clock coincide with a leading edge c of the feedback clock. At the first half timing in FIG. 8A, however, the phase comparator 3 malfunctions to output a loss-of-lock pulse as indicated by the enclosed dotted line.

A method of escaping from loss of lock according to the second embodiment will be described. As shown in FIG. 8A, the NOR gate 19 outputs a pulse like that at N15. The pulse at N15 passes through the NOR gate 16 to generate a reset pulse like that indicated by d at a node N17. The reset pulse indicated by d resets DFFs 13 and 14. In this case, an end time d of the reset pulse at N17 preferably has a long delay from a leading edge time b of the pulse at T0. The position of the leading edge d of the pulse at N17 is determined from the position of the leading edge b of the pulse at T0 via the two-stage NOR gates 19 and 16. For this reason, even the use of the fastest NOR gate will cause a delay, and hence the fastest NOR gate may be used. In the second embodiment, however, in order to reliably escape from loss of lock, either or both of the two-stage NOR gates 19 and 16 are a slow NOR gate. Alternatively, an inverter with an even number of stages is preferably inserted in either or both of the outputs of the two-stage NOR gates 19 and 16 to increase the delay of a pulse at N15 or N17.

As a result of the above escaping operation, this circuit detects the leading edge of a pulse of the feedback clock at T24 like that indicated by e in FIG. 8A, and sets an output at the Q node of the DFF 14 in FIG. 3 to the Vdd potential. The DFF 14 is then reset at a trailing edge h of N17 based on a trailing edge g of T12, and an output at the Q node of the DFF 14 is set to the Gnd potential. As a result, a Down-signal is output to the Dn node of the phase comparator 3 connected to the Q node of the DFF 14 in the interval from time e to time h. As a consequence, the feedback clock FBCLK output to T24 gradually delays. That is, the circuit escapes from the loss-of-lock and returns to the normal state.

A comparison between the Down-signal at the Dn node in the first embodiment and the Down-signal at the Dn node in the second embodiment will reveal that the Down-signal in the second embodiment has a shorter pulse width. That is, the phase comparator in the second embodiment is smaller in gain (=pulse width/phase difference) than the phase comparator in the first embodiment. For this reason, it takes longer time to lock the DLL circuit of the second embodiment than to lock the DLL circuit of the first embodiment. That is, the DLL circuit 1 of the first embodiment is larger in circuit size than the second embodiment, but takes a shorter time to lock the DLL circuit.

Figure 8B:
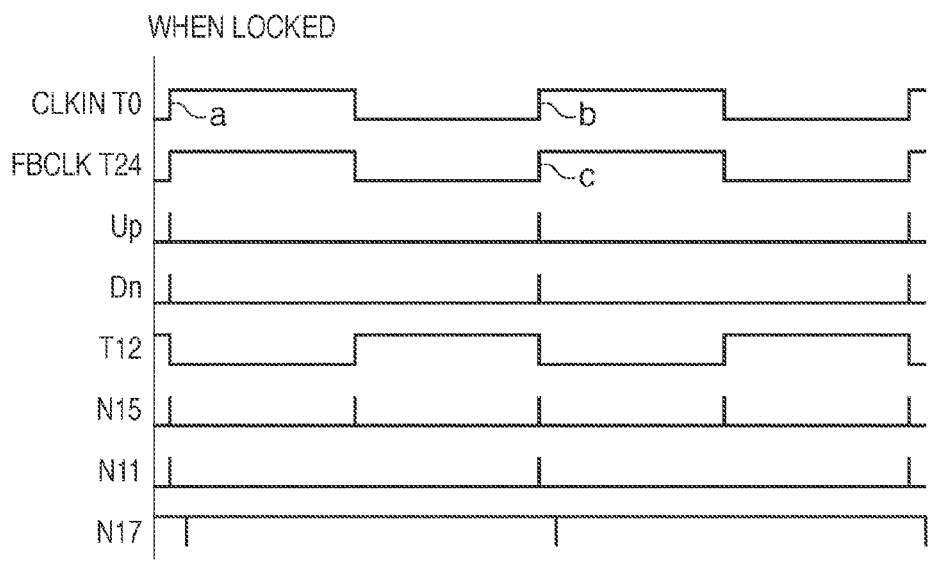

FIG. 8B shows the pulses at the respective nodes when the DLL circuit 1 is locked. When this circuit is locked, the reference clock T0 shifts from the intermediate clock T12 by just half period. As a result, as indicated by N18 in FIG. 8B, short pulses may appear at the leading and trailing edges of the reference clock T0 and clock T12. However, since the pulses of N15 and N17 in FIG. 8B obtained upon detection of the short pulses reset the DFFs 13 and 14 at the timings when the Up- and Down-signals do not appear, the phase comparator 3 keeps normally operating.

Third Embodiment

The third embodiment is almost the same as the first embodiment but is configured to prevent a loss-of-lock detection circuit from outputting short pulses unnecessary for locking to a phase comparator. The overall block diagram of a DLL circuit according to the third embodiment is the same as that shown in FIG. 1 in the first embodiment. The arrangement of the phase comparator is the same as that described with reference to FIG. 3 in the first embodiment.

Figure 9:
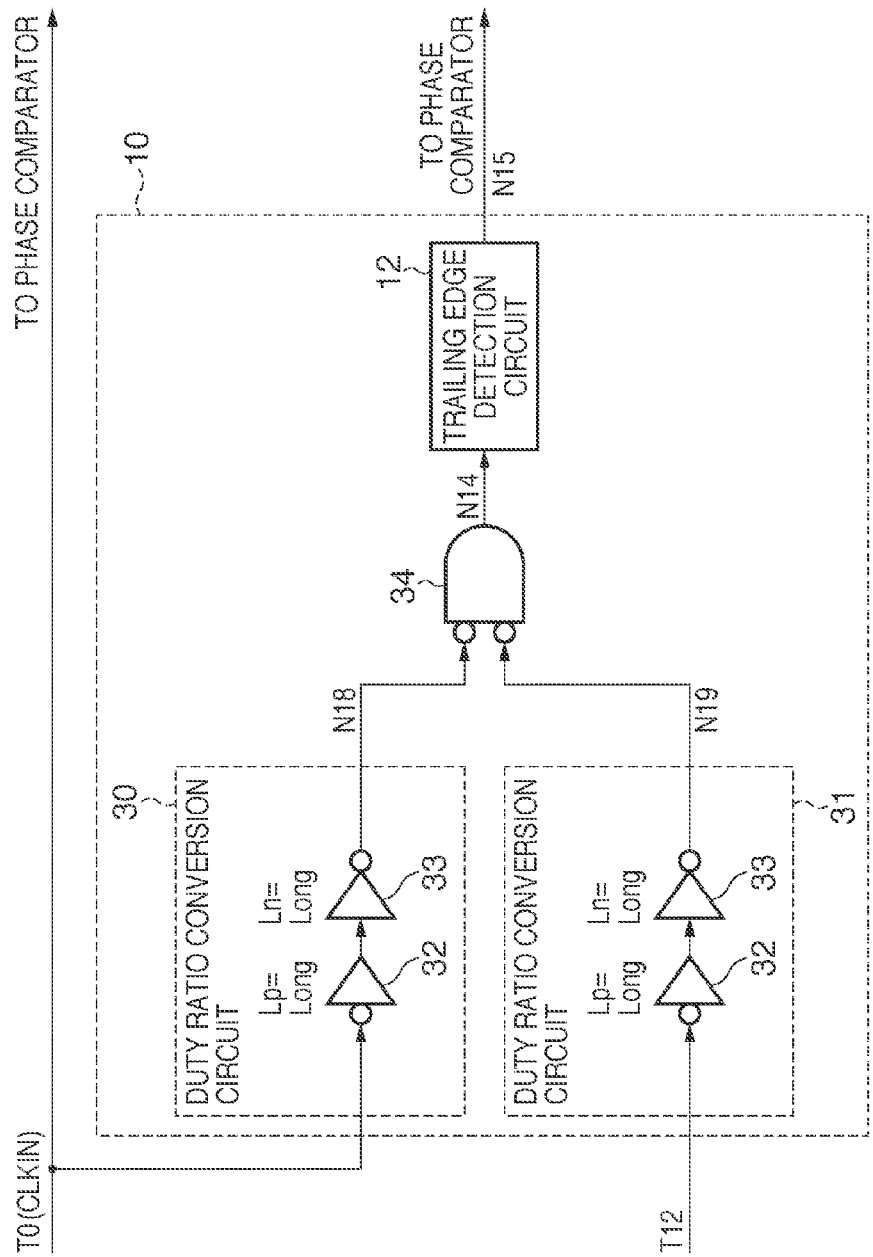
FIG. 9 is a circuit diagram showing an example of the circuit arrangement of a loss-of-lock detection circuit 10 according to the third embodiment.

FIG. 9 is a detailed circuit diagram of a loss-of-lock detection circuit 12 according to the third embodiment. Referring to FIG. 9, reference numerals 30 and 31 denote duty ratio conversion circuits; and 32 and 33, inverters. The same reference numerals as those of the members described above denote the same members. The loss-of-lock detection circuit 12 differs from the loss-of-lock detection circuit 10 shown in FIG. 3 in the first embodiment in that inputs from T0 and T12 are input to a NOR gate 34 via the duty ratio conversion circuits 30 and 31. In this case, the symbol of the NOR gate 34 differs from that of the NOR gate 19 in FIG. 3 because OR logic in the present invention includes NOR logic.

Figure 10A:
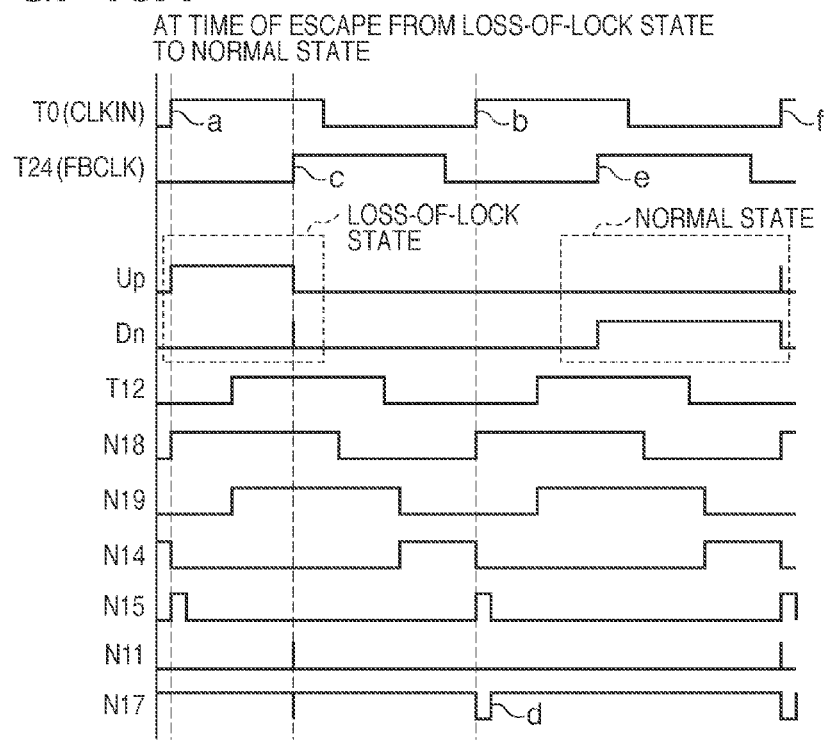
FIGS. 10A and 10B are operation timing charts for explaining releasing of a loss-of-lock state according to the third embodiment.

The operation of the third embodiment will be described with reference to the timing charts of FIGS. 10A and 10B. FIG. 10A is a timing chart showing the operation of escaping from the loss-of-lock state to a normal state. Referring to the timing chart, reference symbols T0, T24, Up, Dn, T12, N18, N19, N15, N11, and N17 denote the voltage waveforms at the respective nodes of the a phase comparator 3 as in FIGS. 9 and 3. As shown in FIG. 10A, when a reference clock CLKIN and a feedback clock FBCLK are input to T0 and T24, the phase comparator 3 should operate to make a leading edge b of the reference clock coincide with a leading edge c of the feedback clock. At the first half timing in FIG. 10A, however, the phase comparator 3 malfunctions to output a loss-of-lock pulse as indicated by the enclosed dotted line.

A method of escaping from loss of lock according to the third embodiment will be described. As shown in FIG. 9, an intermediate clock T12 and the reference clock CLKIN T0 from a VCDL 9 are input to the duty ratio conversion circuits 31 and 30. The duty ratio conversion circuits 31 and 30 each are designed to make the pMOS in the inverter 32 on the input side have a long channel length Lp and to make the nMOS in the inverter 33 have a long channel length Ln. As a result, even if a pulse with a duty ratio of 50% is input to each of the duty ratio conversion circuits 31 and 30, the output is larger than 50% (for example, 55%).

Output nodes N19 and N18 of the duty ratio conversion circuits 31 and 30 are input to the NOR gate 34. The flow of a signal after an output node N14 of the NOR gate 34 is the same as that in the first embodiment described with reference to FIGS. 1 and 3, and hence a description of the signal flow will be omitted.

Figure 10B:
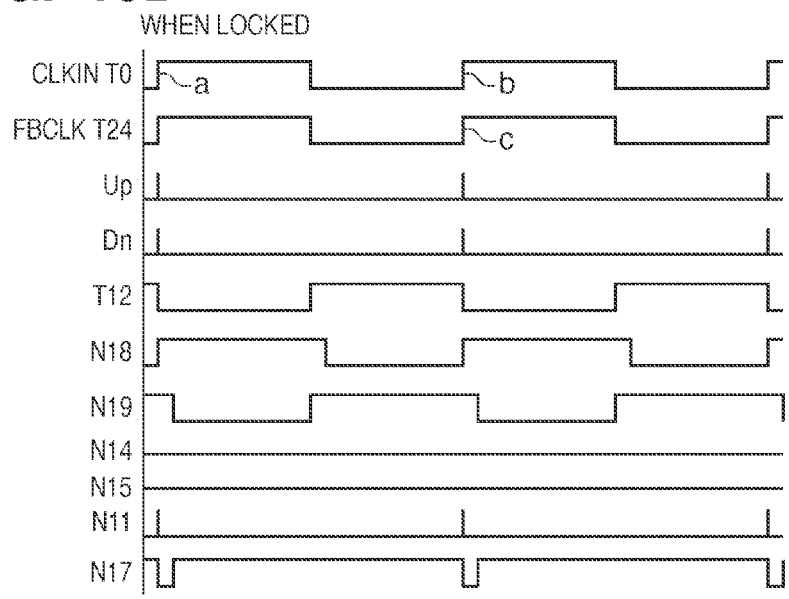

FIG. 10B is a timing chart at the respective nodes when the DLL circuit 1 is locked. When this circuit is locked, the reference clock T0 shifts from the intermediate clock T12 by just half period. As a result, in the first embodiment, short pulses may appear at the leading and trailing edges of the reference clock T0 and intermediate clock T12 as in the case of N14 in FIG. 5B. In contrast, since the third embodiment incorporates the duty ratio conversion circuits 30 and 31, as indicated by the voltage waveforms at the nodes N14 and N15 in FIG. 10B, the loss-of-lock detection circuit 10 outputs no reset pulse when the DLL circuit is locked.

In the third embodiment, the loss-of-lock detection circuit outputs no pulse to reset the phase comparator when the DLL circuit is locked. For this reason, when selecting a phase comparator, there is no need to consider the relationship in signal exchange with a loss-of-lock detection circuit. This can improve the efficiency of design. It is possible to use either static logic described with reference to FIG. 3 or dynamic logic for the phase comparator.

In addition, the third embodiment need not always use the duty ratio conversion circuit 31. While the DLL circuit 1 is locked, short pulses appear at nodes Up and Dn of the phase comparator 3. As a result, short pulses are generated at N11 via an AND 15 (FIG. 10B). If the duty ratio conversion circuit 31 is not used, a short pulse of N15 is generated in the time interval between a trailing edge of T12 and a leading edge of T0. However, this short pulse of N15 appears at almost the same time as a short pulse of N11. This produces no difference in the output result of N17.

Fourth Embodiment

The fourth embodiment sets the first intermediate clock as a clock having a delay time of ⅓ a feedback clock, and causes a VCDL to output the fourth intermediate clock having a delay time of ⅔ the feedback clock. The embodiment then calculates the logical OR of three inputs including the reference clock, the first intermediate clock, and the fourth intermediate clock, and detects the trailing edge of a pulse of the logical OR output, thereby generating a reset signal for a phase comparator.

Figure 11:
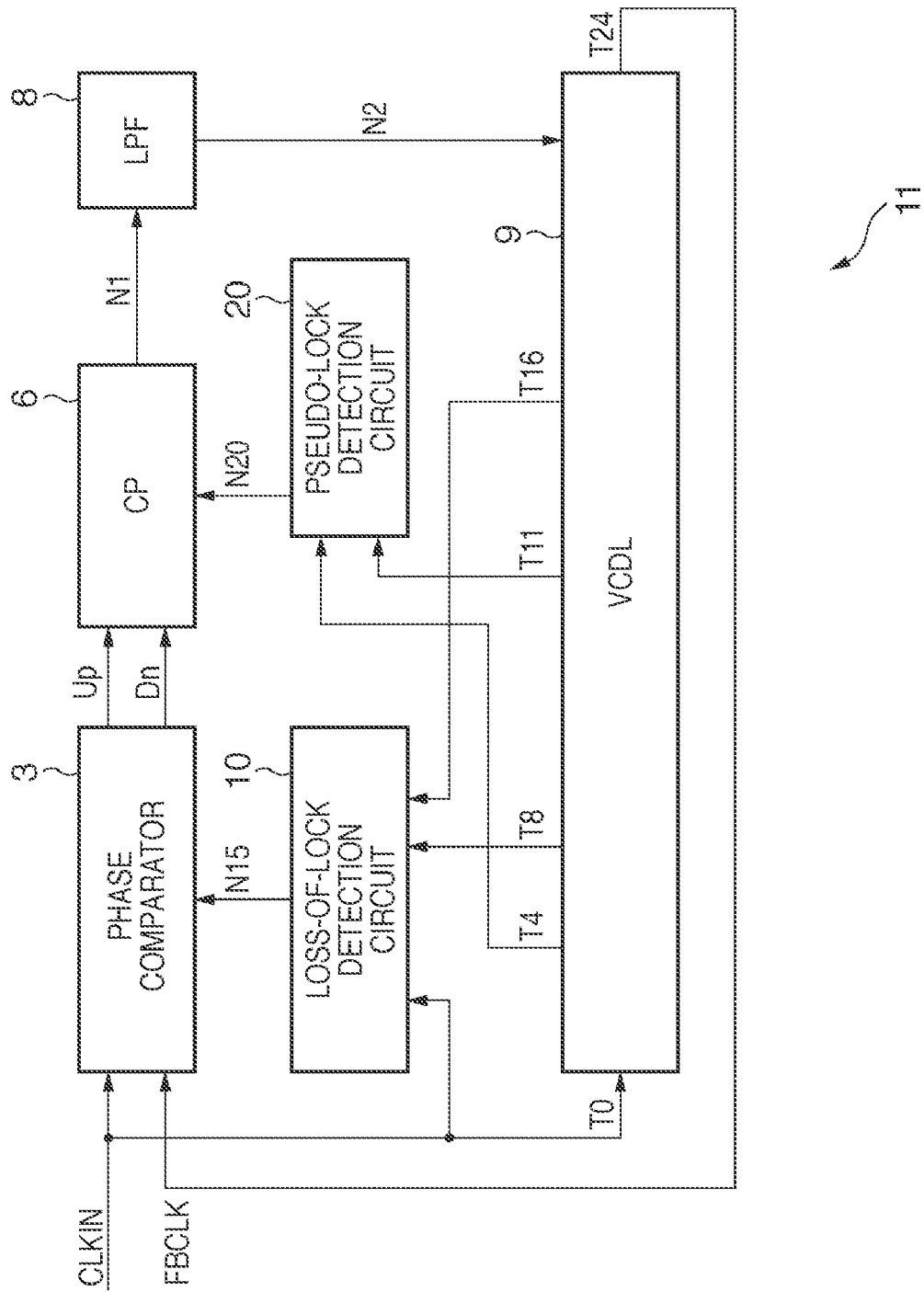
FIG. 11 is a block diagram showing an example of the arrangement of a DLL circuit according to the fourth embodiment.

FIG. 11 is an overall block diagram of a DLL circuit 1' of the fourth embodiment. The same reference numerals as those of the members described above denote the same members. A VCDL 9 outputs intermediate clocks from nodes T8 and T16 to a loss-of-lock detection circuit 10. The arrangement of the loss-of-lock detection circuit 10 in this embodiment differs from that in the first embodiment. More specifically, the first embodiment uses a two-input NOR gate as a NOR gate 19, whereas the fourth embodiment uses a three-input NOR gate. In other respects, these embodiments have the same arrangement. A node T0, the node T8, and the node T16 of the VCDL 9 in FIG. 11 are input to the three-input NOR gate.

Figure 12A:
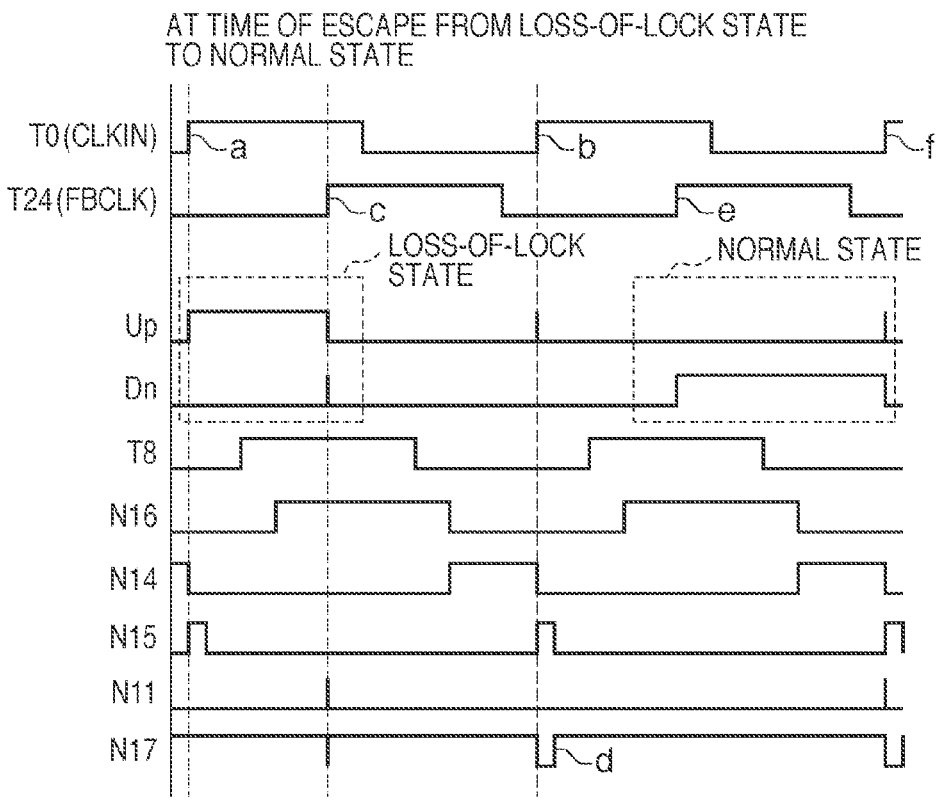
FIGS. 12A and 12B are operation timing charts for explaining releasing of a loss-of-lock state according to the fourth embodiment.
Figure 12B:
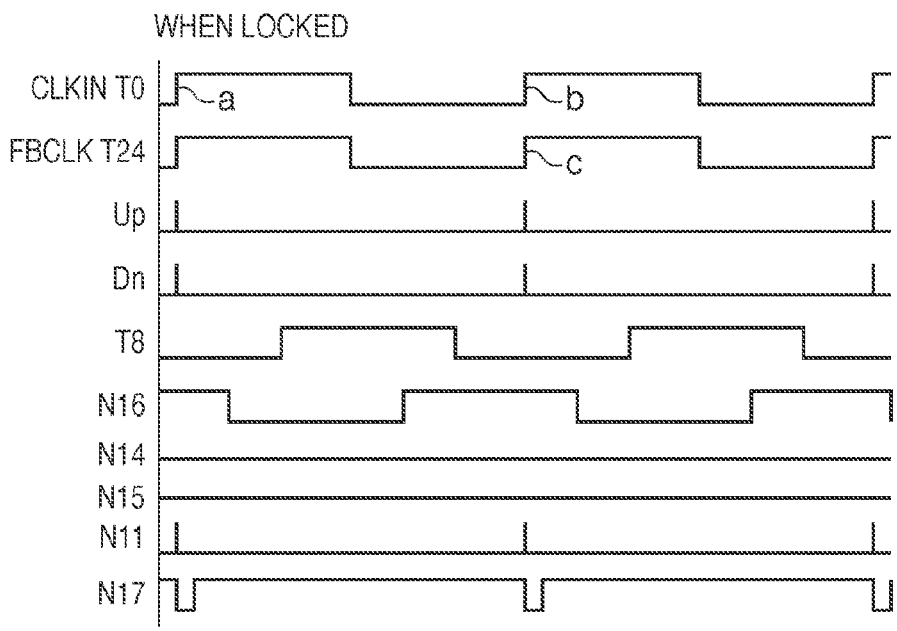
Figure 13:
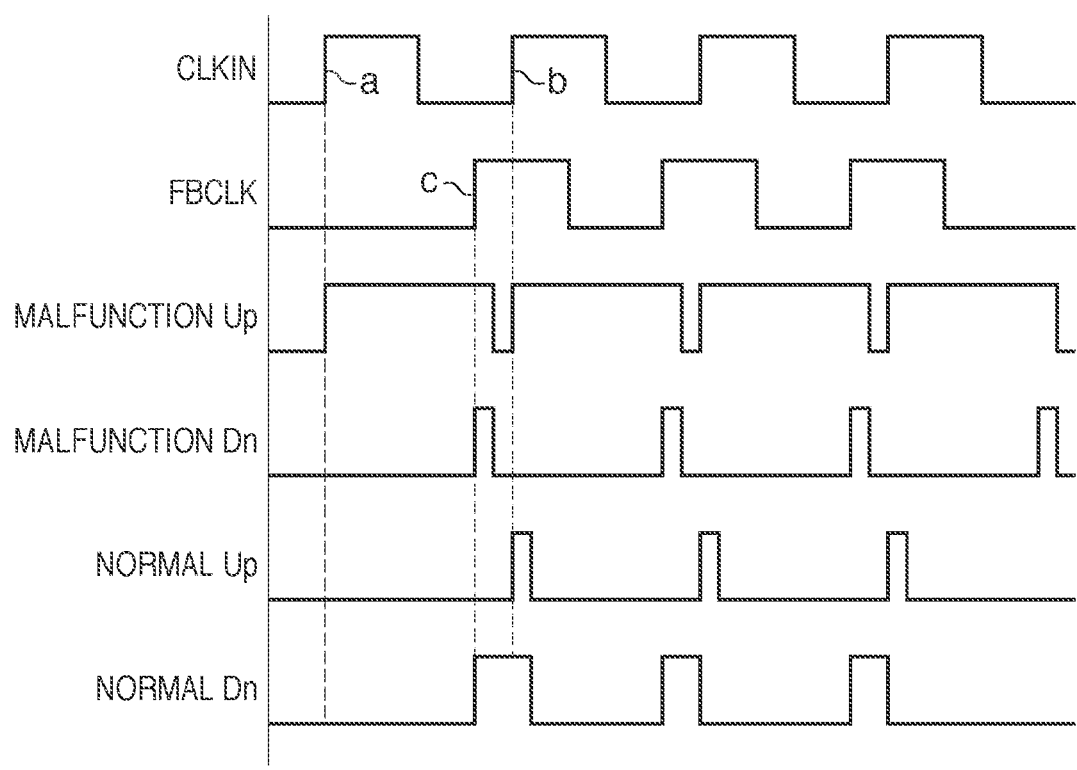
FIG. 13 is a timing chart in the prior art.

FIG. 12A is a timing chart at the time of escape from a loss-of-lock state to a normal state in the fourth embodiment. A three-input NOR gate 35 described above outputs a voltage waveform like N14. In other respects, the operation of this embodiment is the same as that of the first embodiment, and hence a description of the operation will be omitted. FIG. 12B is a timing chart at the respective nodes when a DLL circuit 11 of the fourth embodiment is locked. When this circuit is locked, the reference clock T0 shifts from the first intermediate clock T12 by just half period. As a result, in the first embodiment, short pulses may appear at the leading and trailing edges of the reference clock T0 and first intermediate clock T12 as in the case of N14 in FIG. 5B. In contrast to this, since the fourth embodiment uses the three-input NOR gate 35 for logical OR computation, the loss-of-lock detection circuit 10 outputs no reset pulse when the DLL circuit is locked, as indicated by the voltage waveforms of the node N14 and a node N15 in FIG. 12B.

In the fourth embodiment, the loss-of-lock detection circuit outputs no pulse for resetting the phase comparator when the DLL circuit is locked. For this reason, when selecting a phase comparator, there is no need to consider the relationship in signal exchange with a loss-of-lock detection circuit. This can improve the efficiency of design. It is possible to use either static logic described above or dynamic logic for the phase comparator.

According to the above description, in the fourth embodiment, the reference clock, the first intermediate clock having a delay time of ⅓ the delay time of the feedback clock relative to the reference clock, and the second intermediate clock having a delay time of ⅔ the delay time of the feedback clock are input to the loss-of-lock detection circuit. However, this circuit need not strictly use a reference clock, and may use a clock nearby the reference clock. In addition, the intermediate clocks to be used need not strictly be intermediate clocks having delay times of ⅓ and ⅔, and nearby clocks may be picked up. If the delay time of the feedback clock relative to the reference clock is 1, clocks nearby the reference clock are clocks having delay times within ±⅕ the delay time of the feedback clock. In addition, the first intermediate clock is preferably a clock having a delay time within ⅓±⅕ the delay time of the feedback clock. The second intermediate clock is preferably a clock having a delay time within ⅔±⅕ the delay time of the feedback clock.

Although the fourth embodiment uses the three-input OR gate, it is possible to form a loss-of-lock detection circuit by using an OR gate with more inputs (for example, a four-input OR gate or five-input OR gate) using the idea of the present invention.

Incorporating the DLL circuit of the present invention in a semiconductor chip such as a CMOS sensor can implement clock synchronization in the chip, multiphase clock generation in the chip, clock multiplication, and the like. This makes it possible to design a semiconductor chip with a small clock margin for sampling/holding or the like and hence to provide a high-speed semiconductor chip.

The delay locked loop circuit of each embodiment described above can reliably prevent loss of lock in either of the cases in which an external clock signal is disturbed, initialization is performed upon detection of pseudo-lock, and the power is turned on. In addition, since the loss-of-lock detection circuit is formed by using only a logic circuit, the circuit consumes low power and has a compact layout.

Fifth Embodiment

Figure 14:
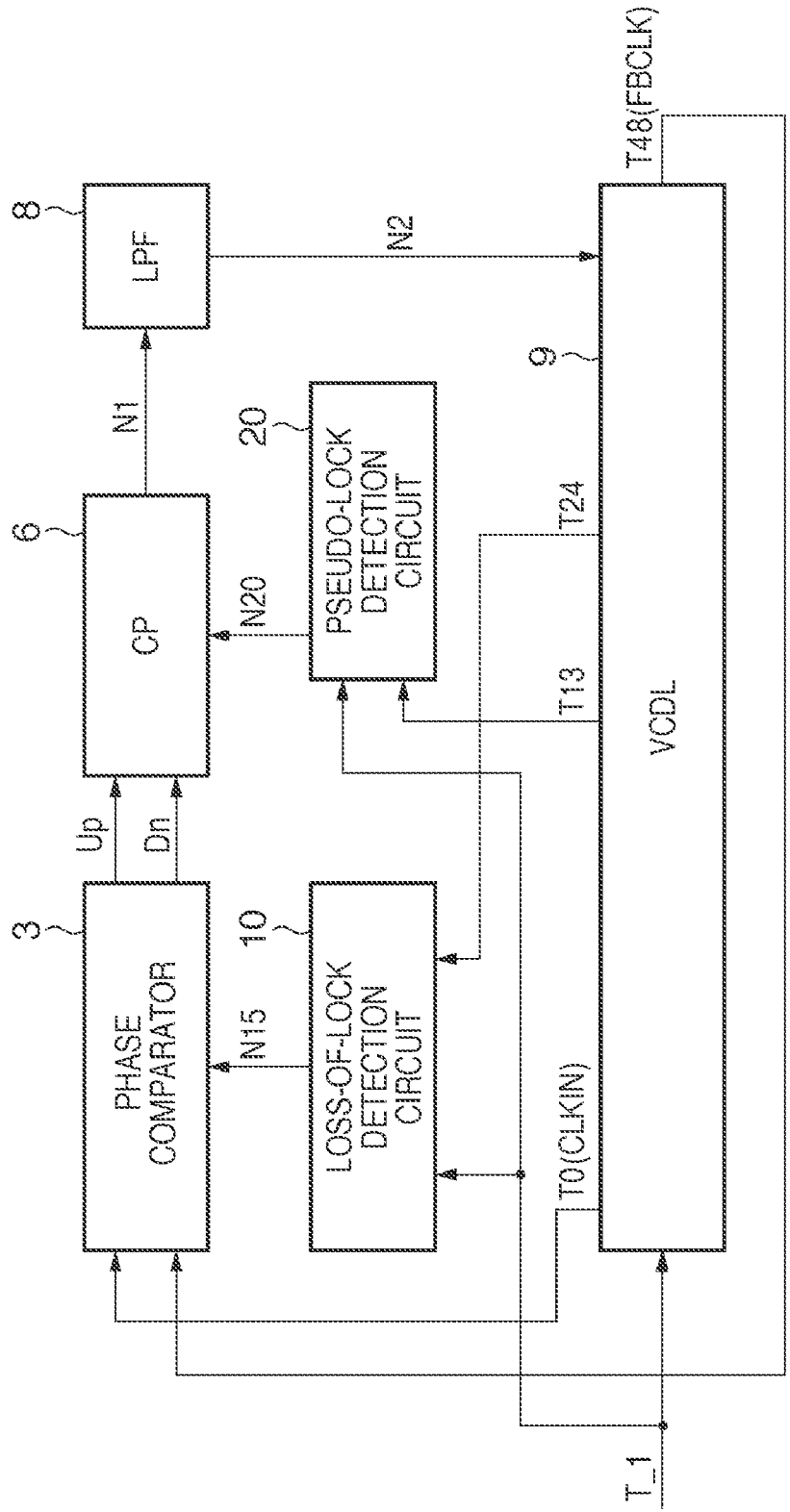
FIG. 14 is a block diagram showing an example of the arrangement of a DLL circuit according to the fifth embodiment.

FIG. 14 is an overall block diagram of a delay locked loop circuit (DLL circuit) 1 according to the fifth embodiment. The same reference numerals as those of the members described above denote the same members.

A VCDL 9 comprises forty-nine internal unit delay elements 50 and receives an external clock T_1 at an input node. The VCDL 9 outputs a reference clock CLKIN from a node T0 and a feedback clock FBCLK from a node T48 via the internal unit delay elements. The VCDL 9 is designed to shorten the delay time of the feedback clock FBCLK relative to the reference clock CLKIN as the voltage of the output node N2 increases. The VCDL 9 further outputs an intermediate clock from a node T13 to a pseudo-lock detection circuit 20 and another intermediate clock from a node T24 to a loss-of-lock detection circuit 10.

The loss-of-lock detection circuit 10 functions as a reset circuit to generate a reset signal from the external clock T_1 and the intermediate clock at the node T24, and can reset the phase comparator 3 via a node N15. The pseudo-lock detection circuit 20 generates a reset signal from the external clock T_1 and an intermediate clock at the node T13, and can reset the CP 6 via a node N20.

Figure 15:
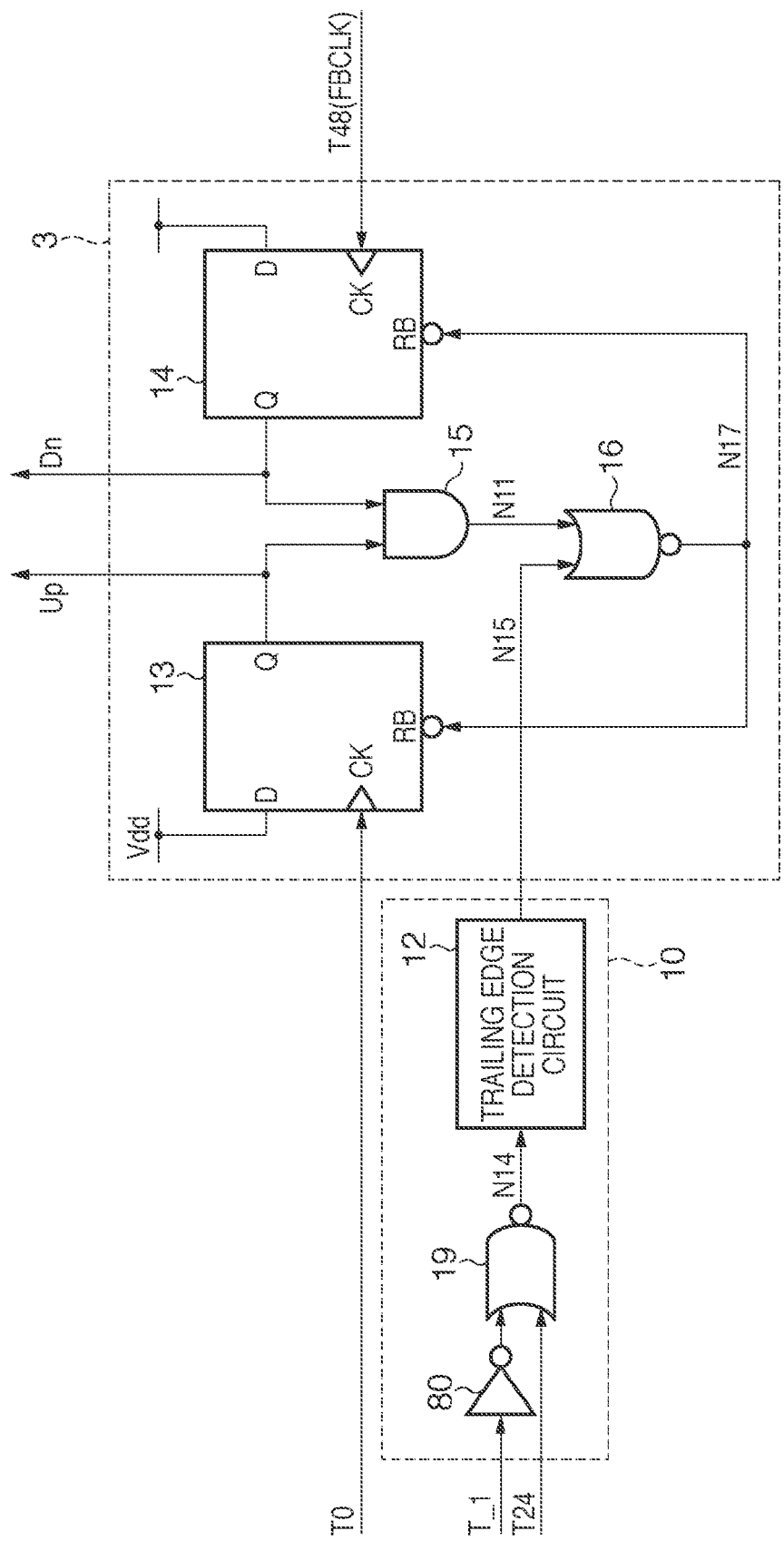
FIG. 15 is a block diagram showing an example of the circuit arrangement of a phase comparator 3 and loss-of-lock detection circuit 10 according to the fifth embodiment.

FIG. 15 shows the internal circuits of the blocks of the phase comparator 3 and loss-of-lock detection circuit 10 in FIG. 14. In FIG. 14, the same reference numerals as those of the members described above denote the same members. The loss-of-lock detection circuit 10 includes the NOR gate 19, the trailing edge detection circuit 12 and the inverter 80. The inverter receives the external clock T_1 and outputs the inverted signal to the NOR gate 19. The NOR gate 19 includes the output from the inverter 80 and the node T24 as input nodes, and a node N14 as an output node. That is, the NOR gate 19 is configured to operate the logical OR between the intermediate clock at the node T24 with a delay time of ½ the node T48 and the external clock T_1 nearby the reference clock CLKIN at the node T0 and invert the output. This output is a pulse at the node N14.

The trailing edge detection circuit 12 receives the pulse at the node N14 and detects the trailing edge of the pulse at N14 to output a short pulse. The circuit configuration of the trailing edge detection circuit 12 is the same as the one illustrated in FIG. 4 in the first embodiment.

The operations of the phase comparator 3 and loss-of-lock detection circuit 10 in FIG. 15 will be described with reference to operation timing charts of FIGS. 16A to 16C. FIG. 16A shows an operation for escaping from a loss-of-lock state to a normal state. Referring to FIGS. 16A to 16C, $T_{13}$ 1, T0, T48, Up, Dn, T24, N14, N15, N11, and N17 denote voltage waveforms at the respective nodes in FIG. 14. As shown in FIG. 16A, when the reference clock CLKIN and the feedback clock FBCLK are input to T0 and T48, the phase comparator 3 should operate to make a leading edge b of the reference clock coincide with a leading edge c of the feedback clock. At the earlier part of timing in FIG. 16A, the phase comparator 3 malfunctions to output a signal pulse in a loss-of-lock state as indicated by the enclosed dotted line. This loss of lock occurs when the power is turned on or an external clock is disturbed or when initialization is performed upon detection of pseudo-lock (the delay time is minimized).

The process of escaping from this loss-of-lock state to the normal state will be described next. As shown in FIG. 16A, the NOR gate 19 outputs a pulse like N14. The trailing edge detection circuit 12 then outputs a short pulse upon detection of the trailing edge of the pulse at N14, as indicated by the waveform at N15. The NOR gate 16 in FIG. 15 receives the pulse at the node N15 generated in this manner, and outputs a reset pulse like that indicated by d at N17 in FIG. 16A. The reset pulse like that indicated by d at N17 then resets the DFFs 13 and 14. As a consequence, the leading edge of a pulse of the feedback clock at T48 like that indicated by e in FIG. 16A is detected, and the Q node of the DFF 14 in FIG. 15 is set to the Vdd potential. The Q node of the DFF 14 is kept at the Vdd potential until the Q node of the DFF 13 is set to the Vdd potential at the leading edge of the reference clock at T0 like that indicated by f. Thereafter, the Q node is set to the Gnd potential. As a result, a Down-signal is output to the Dn node of the phase comparator 3 connected to the Q node of the DFF 14 in the interval between times e and f. This gradually delays the feedback clock FBCLK output to T48. That is, this circuit has escaped from the loss-of-lock state and returned to the normal state.

Outputting normal Up- and Down-signals to the Up and Dn nodes of the phase comparator 3 in this manner will lower the potentials at N1 and N2 in FIG. 14 and gradually increase the delay time of the feedback clock (T48) relative to the reference clock (T0). When the delay time of the feedback clock (T48) relative to the reference clock (T0) coincides with one period, a DLL circuit 1 is locked.

FIG. 16B shows pulses at the respective nodes of the DLL circuit 1 when it is locked. Since the reset pulse from the loss-of-lock detection circuit 10 at N15 resets the DFFs 13 and 14 at the timings when the Up- and Down-signals at the Up and Dn nodes do not appear, the phase comparator 3 keeps normally operating.

FIG. 16C is a timing chart representing operation performed when the feedback clock FBCLK delays from the reference clock CLKIN. Since the reset pulse from the loss-of-lock detection circuit 10 at N15 resets the DFFs 13 and 14 at the timings when the Up- and Down-signals at the Up and Dn nodes do not appear, the phase comparator 3 keeps normally operating.

Figure 17:
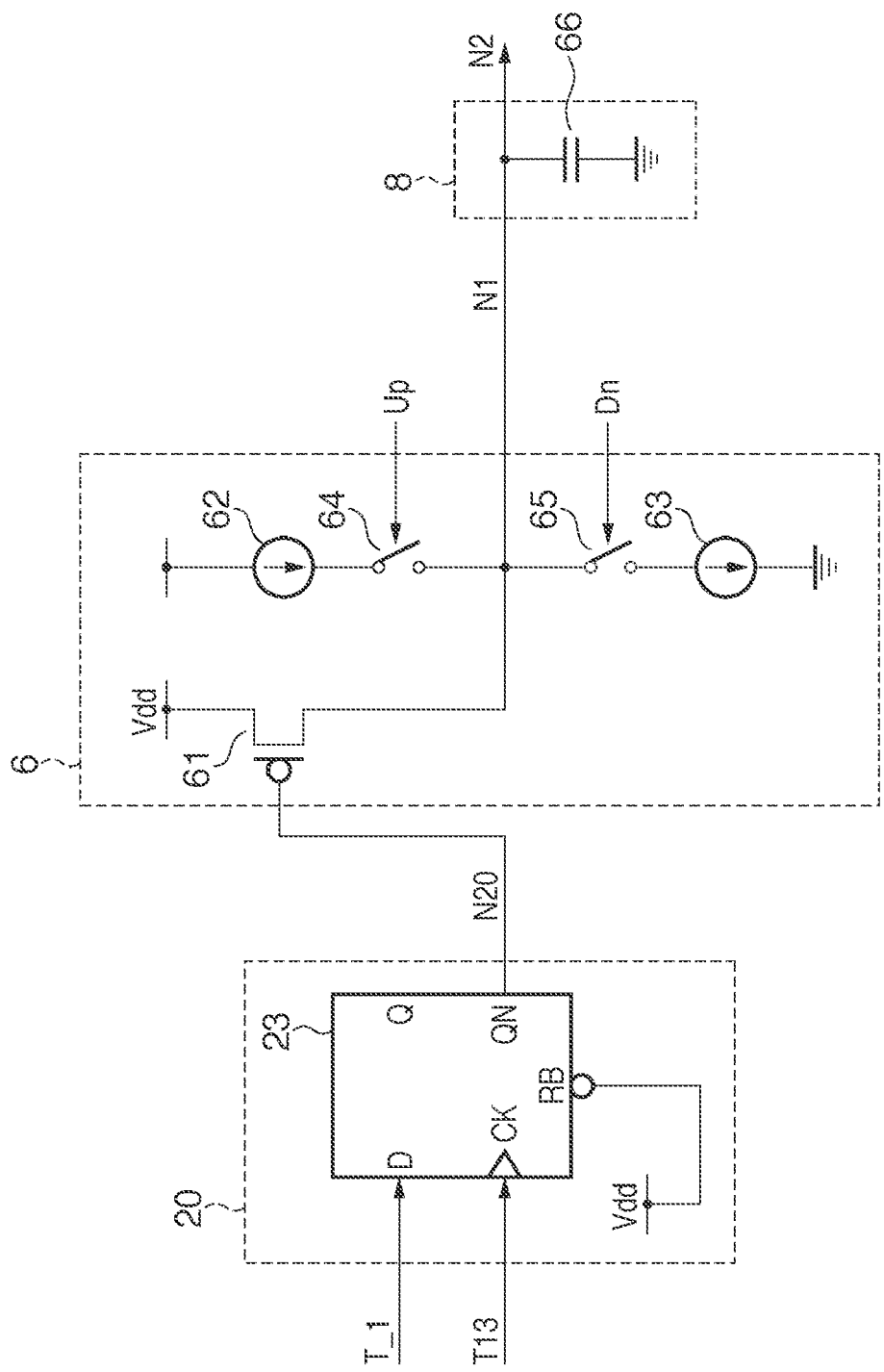
FIG. 17 is a circuit diagram showing an example of the circuit arrangement of a pseudo-lock detection circuit 20, CP 6, and LPF 8 according to the fifth embodiment.

FIG. 17 is a circuit diagram of the pseudo-lock detection circuit 20, CP 6, and LPF 8. The pseudo-lock detection circuit 20, CP 6, and LPF 8 in FIG. 14 will be described with reference to FIG. 17. In FIG. 17, the same reference numerals as those of the members described above denote the same members. The pseudo-lock detection circuit 20 includes a DFF 23. The external clock T_1 and an intermediate clock T13 are input to the D and CK nodes of the DFF 23, respectively. An output from the Q node of the DFF 23 is then connected to the gate of the pMOS 61 of the CP 6.

Figure 18A:
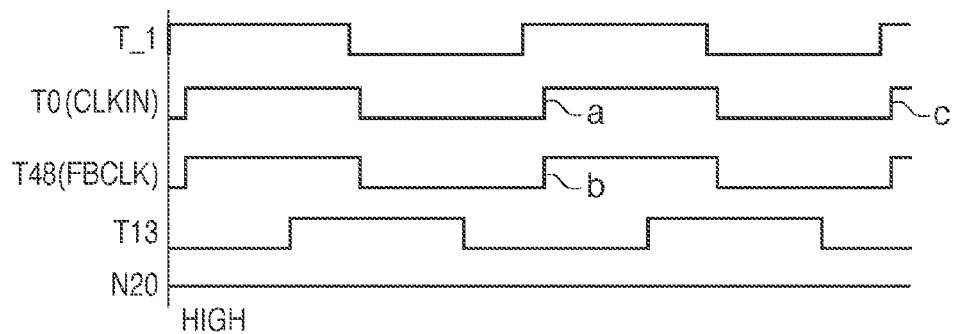
FIGS. 18A and 18B are timing charts for explaining pseudo-lock releasing operation in the fifth embodiment.
Figure 18B:
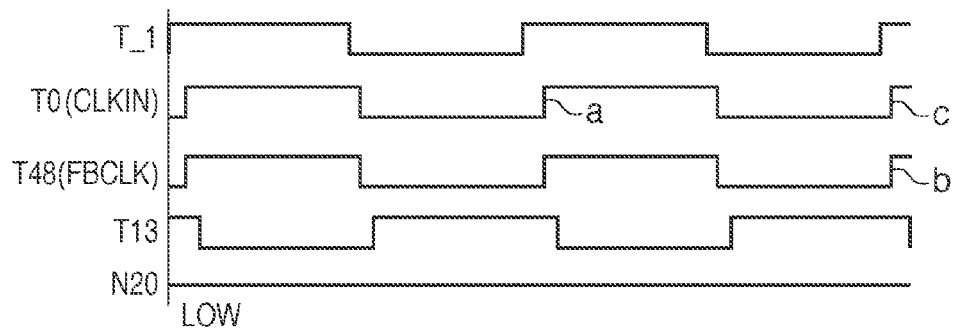

FIGS. 18A and 18B are timing charts associated with the pseudo-lock detection circuit 20. FIG. 18A shows voltage waveforms of T_1, T0, T48, T13, and N20 in a normal locked state. At this time, leading edges a and b of T0 and T48 coincide with each other, and T_1 is at the Vdd (High) potential at the leading edge of a pulse of T13 (CK node). The DFF 23 in FIG. 17 is in a set state upon application of the Vdd potential to the RB node, and hence the DFF 23 outputs the potential at the D node at the leading edge of a pulse at the CK node to the Q node. Therefore, N20 is always at the Vdd potential, and the pMOS 61 of the CP 6 is kept off. The potentials at N1 and N2 are kept at the potential set when the DLL circuit 1 is locked.

FIG. 18B is a timing chart in a case in which pseudo-lock with a delay of one period occurs. Although the leading edges a and b of T0 and T48 should be locked, a leading edge c delayed from the leading edge a of T0 by one period and the leading edge b of T48 are locked, resulting in a pseudo-lock state. In this case, at the leading edge of the pulse of T13 (CK node), T_1 (D node) is at the Gnd potential. For this reason, N20 (Q node) is set at the Gnd (Low) potential, and the pMOS 61 in the CP 6 is turned on to raise the potentials at N1 and N2 to the Vdd potential. As a result, the delay time of the VCDL 9 is minimized, and the DLL circuit 1 is restored to the initial state.

The loss-of-lock prevention method according to the fifth embodiment can prevent loss of lock even when the DLL circuit 1 is restored to the initial state upon detection of pseudo-lock. This is because, the loss-of-lock detection circuit 10 according to the fifth embodiment allows restoration from the loss-of-lock state to the normal state by resetting the phase comparator 3 when the DLL circuit 1 is in a loss-of-lock state. In addition, since the external clock is provided to the loss-of-lock detection circuit 10 and the pseudo-lock detection circuit 20 to decrease the output load of the VCDL, the output signals from the VCDL become well symmetric. Thus, the phase difference between the reference clock and the feedback clock can be minimized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-181966, filed Aug. 4, 2009, and No. 2010-165346, filed Jul. 22, 2010, which are hereby incorporated by reference herein in their entirety.

What is claimed is:

1. A delay locked loop circuit comprising:
a voltage controlled delay line (VCDL) which outputs a feedback clock by delaying an input clock in accordance with a magnitude of a control voltage;
a phase comparator which detects a phase difference between the feedback clock and a reference clock by comparing the feedback clock with the reference clock, and outputs an Up-signal for raising the control voltage and a Down-signal for lowering the control voltage in accordance with the phase difference;
a control voltage generation circuit which determines the control voltage in accordance with the Up-signal and the Down-signal, and outputs the control voltage to said voltage controlled delay line; and
a reset circuit which resets said phase comparator based on an logical OR between the reference clock and a first intermediate clock which is a signal obtained by delaying the input clock by said voltage controlled delay line and is output before the feedback clock.

2. The circuit according to claim 1, wherein said phase comparator outputs the Up-signal to reduce a delay in said voltage controlled delay line after resetting by said reset circuit when the phase difference between the reference clock and the feedback clock is larger than a phase difference corresponding to one period, and outputs the Down-signal to increase a delay in said voltage controlled delay line after resetting by said reset circuit when the phase difference between the reference clock and the feedback clock is smaller than a phase difference corresponding to one period.

3. The circuit according to claim 1, wherein the delay increases on said voltage controlled delay line as the control voltage drops, and
the first intermediate clock has a delay time of substantially ½ a delay time of the feedback clock relative to the reference clock.

4. The circuit according to claim 1, further comprising an initialization circuit which outputs an initialization signal to said control voltage generation circuit, when a second intermediate clock rises while a third intermediate clock is on, wherein the second and third intermediate clocks are signals obtained by delaying the input clock on said voltage controlled delay line and are output before the feedback clock within one period, and the third intermediate clock output after the second intermediate clock,
wherein said control voltage generation circuit initializes the control voltage by setting the control voltage to a maximum value which the control voltage has, in accordance with input of the initialization signal.

5. The circuit according to claim 1, wherein said reset circuit includes a duty ratio conversion circuit which increases a duty ratio between the reference clock and the first intermediate clock from ½, and computes the logical OR between the reference clock whose duty ratio is converted and the first intermediate clock.

6. The circuit according to claim 1, wherein the first intermediate clock has a delay time of substantially ⅓ the delay time of the feedback clock relative to the reference clock, and
said reset circuit computes the logical OR by using the reference clock, the first intermediate clock, and a fourth intermediate clock having a delay time of substantially ⅔ the delay time of the feedback clock relative to the reference clock.

7. The circuit according to claim 1, wherein the reference clock is one of the input clock and a signal nearby the input clock.

8. The circuit according to claim 7, wherein when a delay time of the feedback clock relative to the input clock is 1, the signal nearby the input clock is a signal having a delay time within ±⅕ the delay time relative to the input clock.

9. A delay locked loop circuit comprising:
a voltage controlled delay line (VCDL) which outputs a reference clock and a feedback clock by delaying an input clock in accordance with a magnitude of a control voltage;
a phase comparator which detects a phase difference between the reference clock and the feedback clock by comparing the feedback clock with the reference clock, and outputs an Up-signal for raising the control voltage and a Down-signal for lowering the control voltage in accordance with the phase difference;
a control voltage generation circuit which determines the control voltage in accordance with the Up-signal and the Down-signal, and outputs the control voltage to said voltage controlled delay line; and
a reset circuit which resets said phase comparator based on an logical OR between the input clock and a first intermediate clock which is a signal obtained by delaying the input clock by said voltage controlled delay line and is output before the feedback clock.

10. The circuit according to claim 9, wherein said phase comparator outputs the Up-signal to reduce a delay in said voltage controlled delay line after resetting by said reset circuit when the phase difference between the reference clock and the feedback clock is larger than a phase difference corresponding to one period, and outputs the Down-signal to increase a delay in said voltage controlled delay line after resetting by said reset circuit when the phase difference between the reference clock and the feedback clock is smaller than a phase difference corresponding to one period.

11. The circuit according to claim 9, wherein the delay increases on said voltage controlled delay line as the control voltage drops, and
the first intermediate clock has a delay time of substantially ½ a delay time of the feedback clock relative to the reference clock.

12. The circuit according to claim 9, further comprising an initialization circuit which outputs an initialization signal to said control voltage generation circuit, when the input clock rises while a second intermediate clock is on, wherein the second intermediate clock is a signal obtained by delaying the input clock on said voltage controlled delay line and is output before the feedback clock within one period, wherein said control voltage generation circuit initializes the control voltage by setting the control voltage to a maximum value which the control voltage has, in accordance with input of the initialization signal.

* * * * *